(12) United States Patent
Hiramatsu et al.

(10) Patent No.: US 10,892,923 B2
(45) Date of Patent: Jan. 12, 2021

(54) SIGNAL OUTPUT CIRCUIT, TRANSMISSION CIRCUIT AND INTEGRATED CIRCUIT

(71) Applicant: SOCIONEXT INC., Yokohama (JP)

(72) Inventors: Taku Hiramatsu, Yokohama (JP); Shigeaki Kawai, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 16 days.

(21) Appl. No.: 16/255,388

(22) Filed: Jan. 23, 2019

(65) Prior Publication Data

US 2019/0245721 A1     Aug. 8, 2019

(30) Foreign Application Priority Data

Feb. 8, 2018   (JP) .................................. 2018-021183
Jun. 28, 2018  (JP) .................................. 2018-123104

(51) Int. Cl.

| H04L 25/49 | (2006.01) |
|---|---|
| H03K 17/687 | (2006.01) |
| H04B 1/04 | (2006.01) |
| H03K 19/0175 | (2006.01) |

(52) U.S. Cl.
CPC ....... H04L 25/4917 (2013.01); H03K 17/687 (2013.01); H03K 19/0175 (2013.01); H04B 1/04 (2013.01)

(58) Field of Classification Search
CPC ............. H03K 17/687; H03K 17/6872; H03K 17/6873; H03K 17/6878; H03K 17/693; H03K 19/017; H03K 19/01728; H03K 19/0175; H04B 1/04; H04B 1/0483; H04L 25/026; H04L 25/0264; H04L 25/0272; H04L 25/028; H04L 25/0282; H04L 25/0286; H04L 25/40; H04L 25/4917;
(Continued)

(56) References Cited

U.S. PATENT DOCUMENTS 7,206,516 B2 * 4/2007 Eiselt ................. H04B 10/2513
                                                            398/147
2014/0111250 A1   4/2014 Li et al.
(Continued)

FOREIGN PATENT DOCUMENTS

JP   2009-038546 A   2/2009
JP   2016-502307 A   1/2016
(Continued)

Primary Examiner — Young T. Tse
(74) Attorney, Agent, or Firm — Arent Fox LLP

(57) ABSTRACT

A signal output circuit includes: a driver circuit including a variable current source and configured to output a multilevel signal; a replica circuit having a circuit configuration equivalent to the driver circuit; and a control circuit configured to control a characteristic of the driver circuit, based on an output signal of the replica circuit, wherein the replica circuit includes: a first replica circuit part configured to output first output signals having signal levels of a first subset of a plurality of signal levels corresponding to the multilevel signal; and a second replica circuit part configured to output second output signals having signal levels of a second subset of the plurality of signal levels, and the control circuit is configured to control a characteristic of the variable current source, based the first output signals and the second output signals.

20 Claims, 18 Drawing Sheets

(58) Field of Classification Search
CPC ............. H04L 25/4921; H04L 25/4923; H04L 25/4927
USPC ....... 375/219–222, 232, 233, 257, 286, 288, 375/293, 294, 354–356; 326/82, 83, 86, 326/87, 93, 95; 327/105, 108, 109, 272; 370/282, 284
See application file for complete search history.

(56) References Cited

U.S. PATENT DOCUMENTS

| | | | |
|---|---|---|---|
| 2015/0061745 A1* | 3/2015 | Shih | H04L 25/00 327/333 |
| 2016/0241235 A1 | 8/2016 | Hasegawa | |
| 2018/0026626 A1* | 1/2018 | Teo | H03K 17/6871 327/109 |
| 2018/0069542 A1* | 3/2018 | Bonthron | H03K 7/02 |

FOREIGN PATENT DOCUMENTS

| | | |
|---|---|---|
| WO | WO 2012/117456 A1 | 9/2012 |
| WO | WO 2016/035192 A1 | 3/2016 |

\* cited by examiner

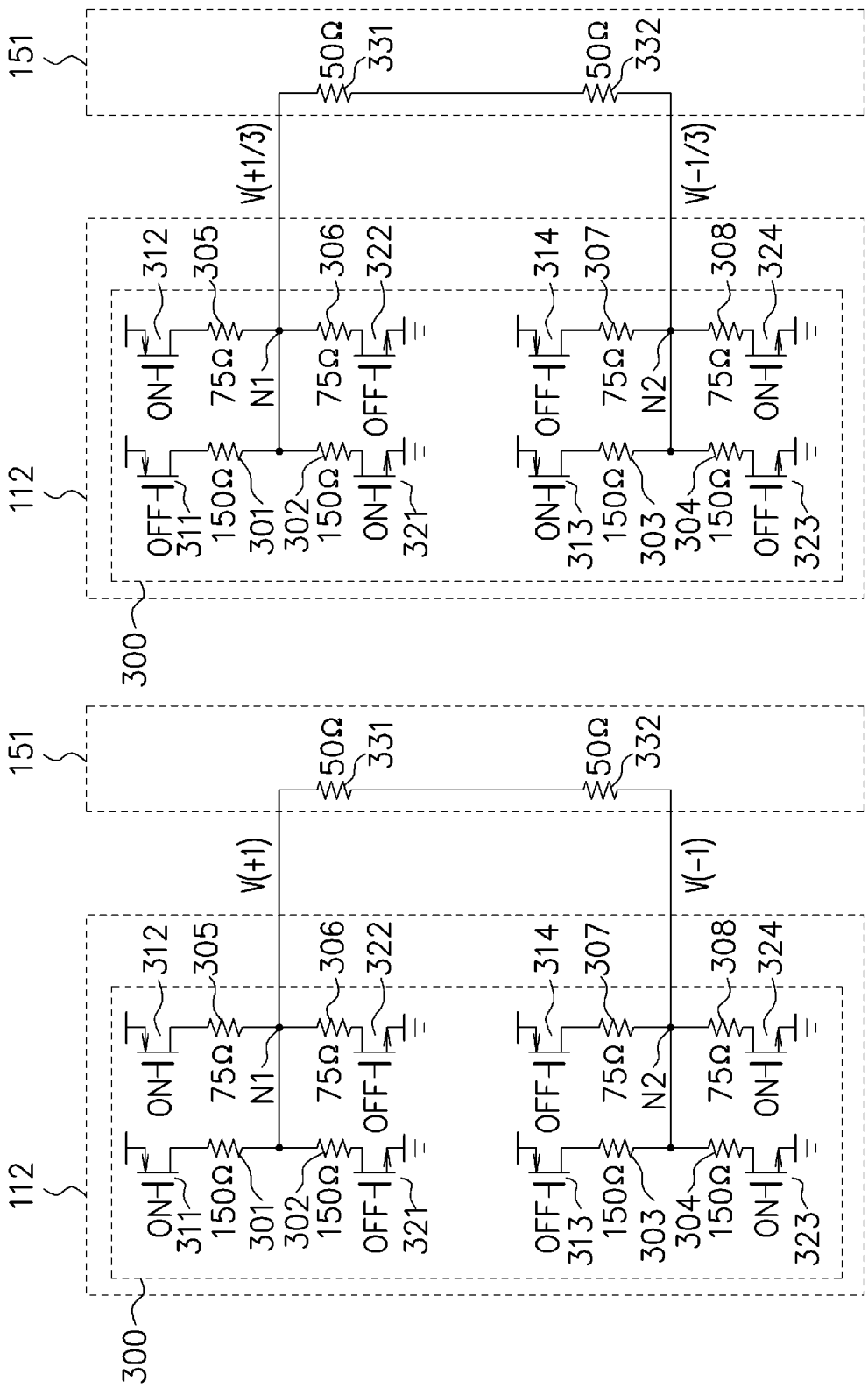

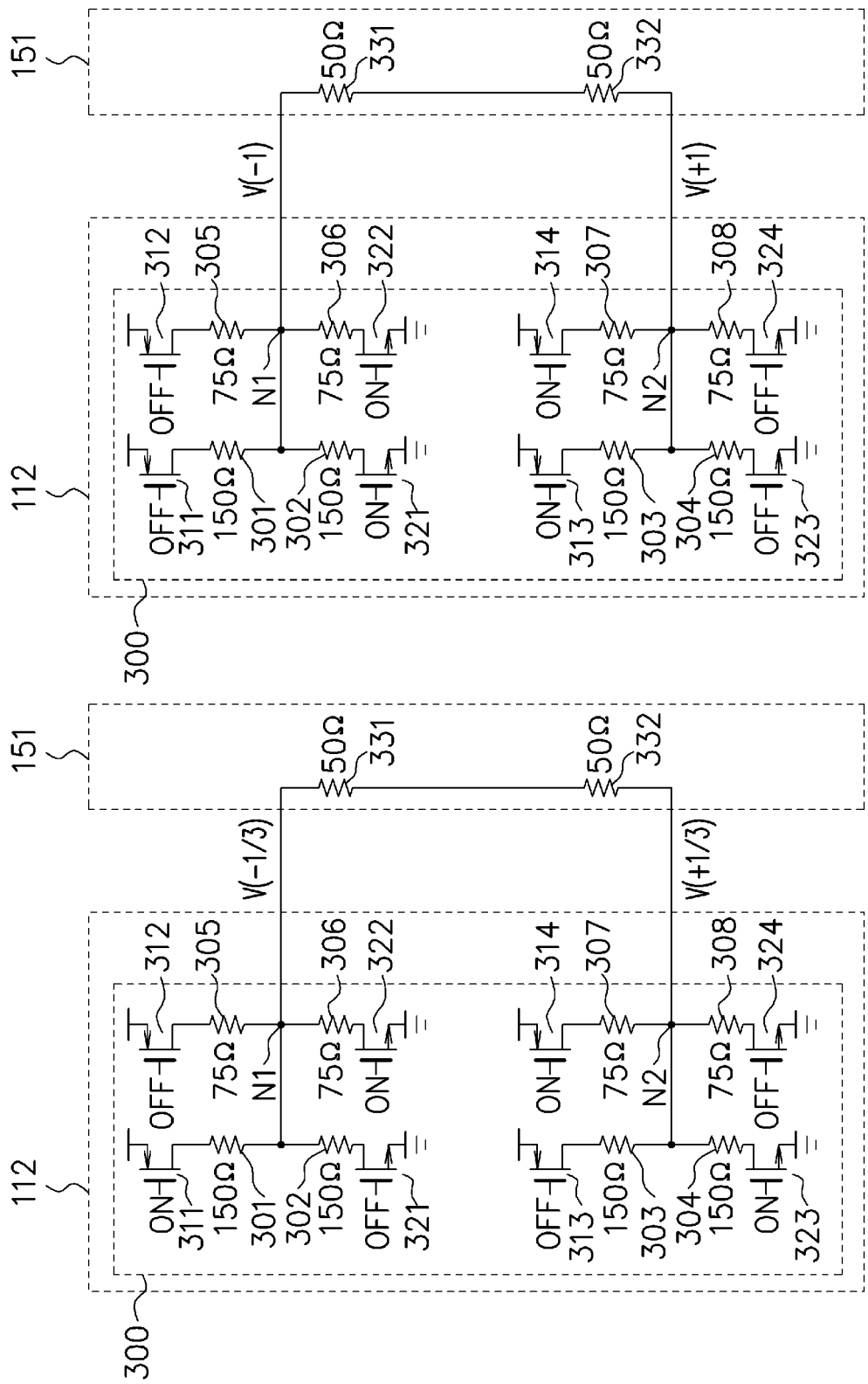

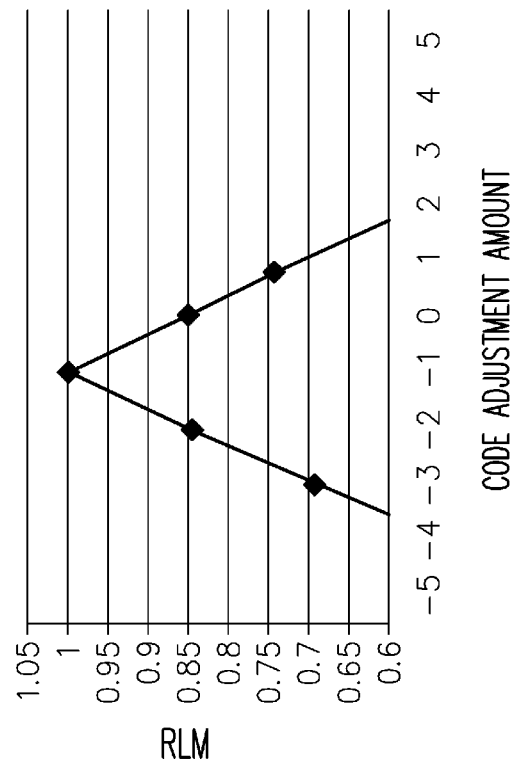
F I G. 5B
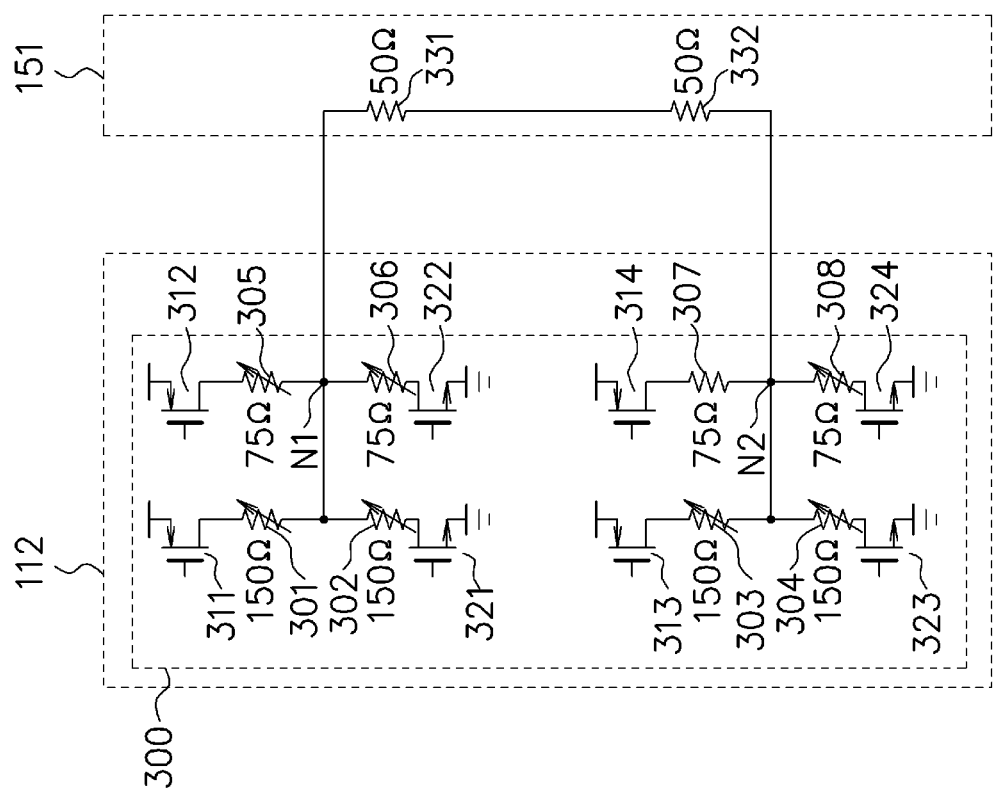
F I G. 5A

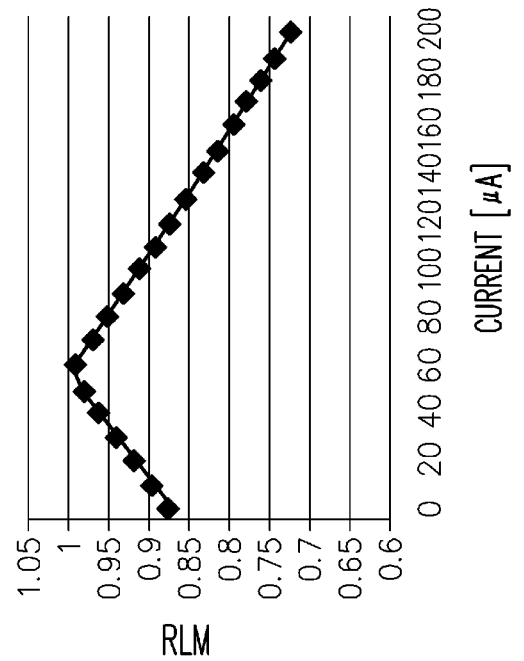
F I G. 6B
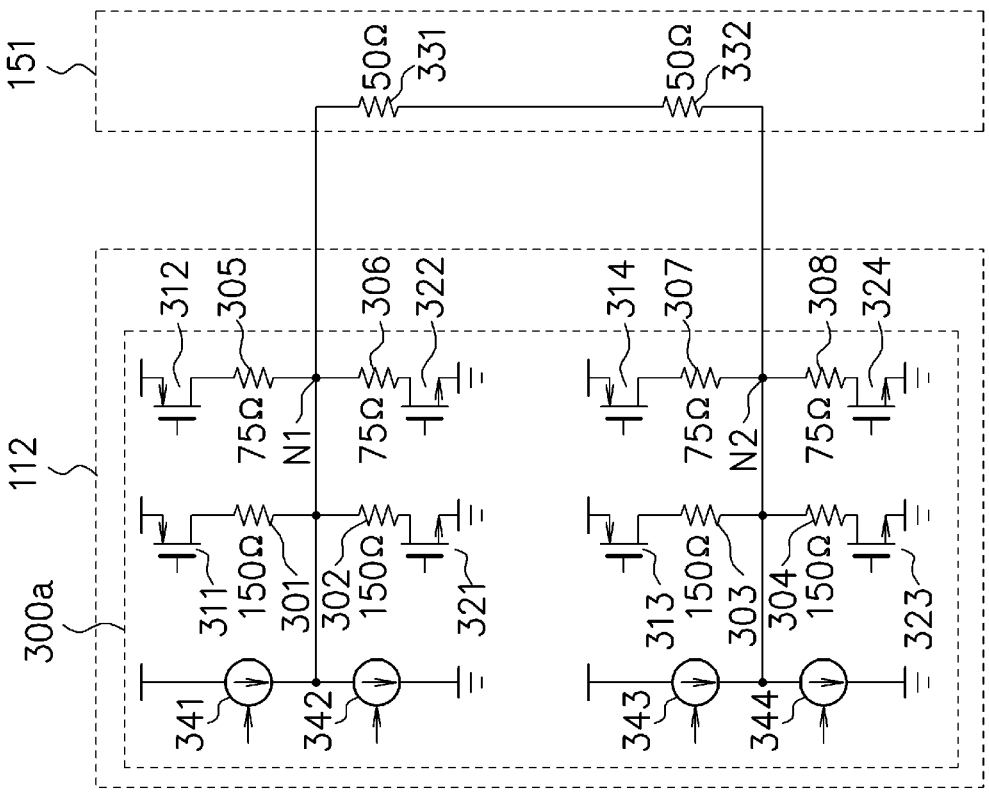
F I G. 6A

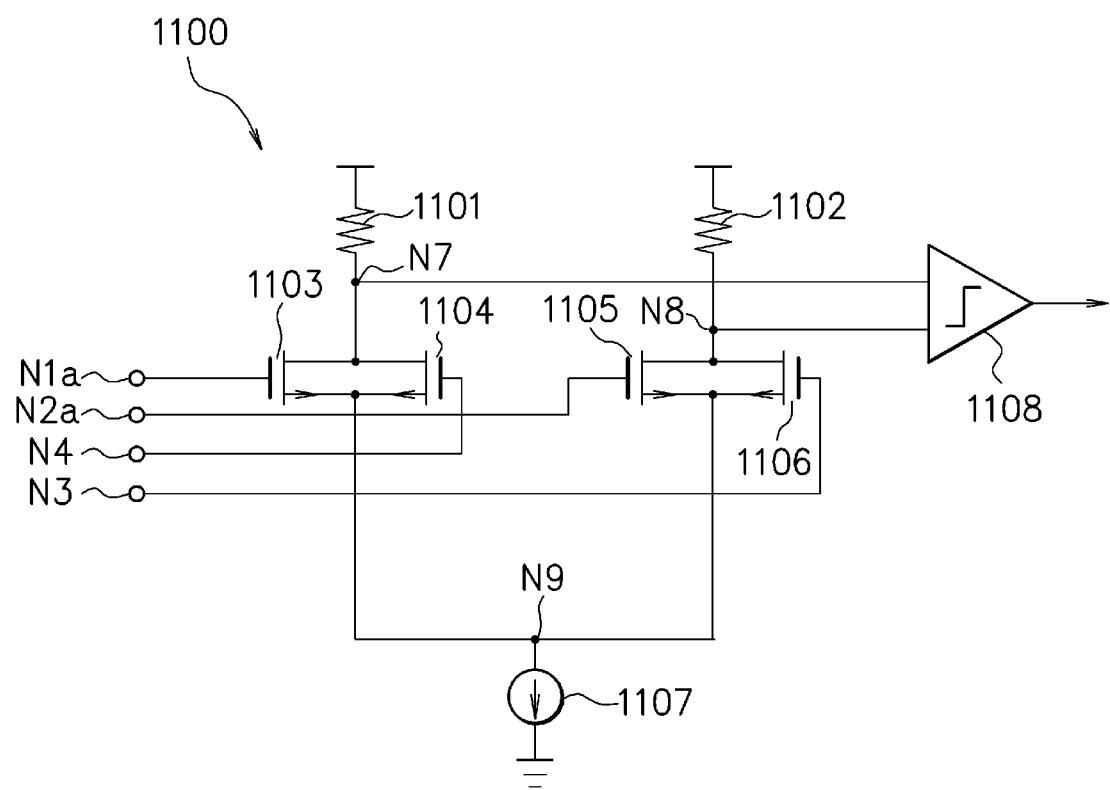
F I G. 11

F I G. 18
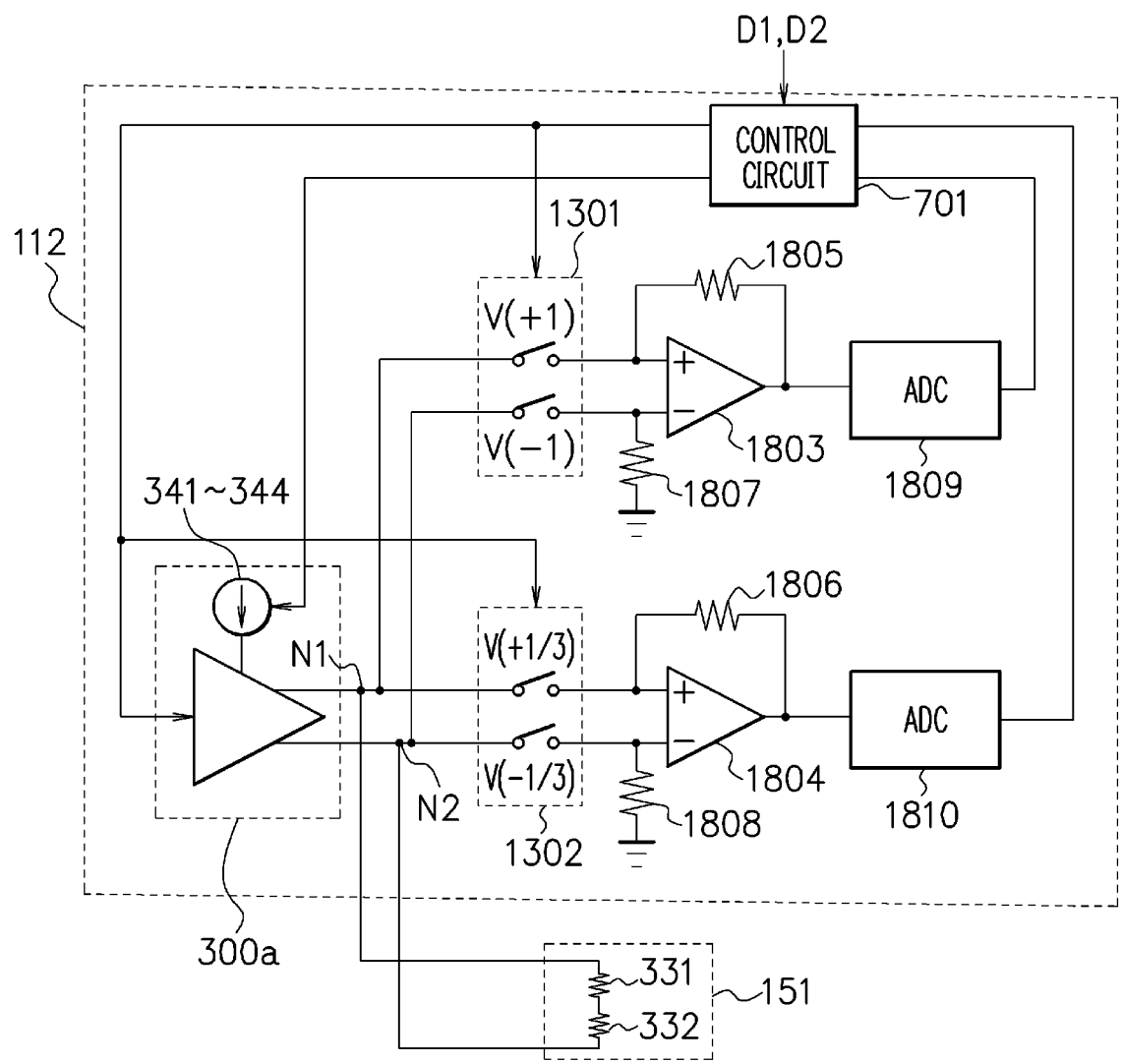

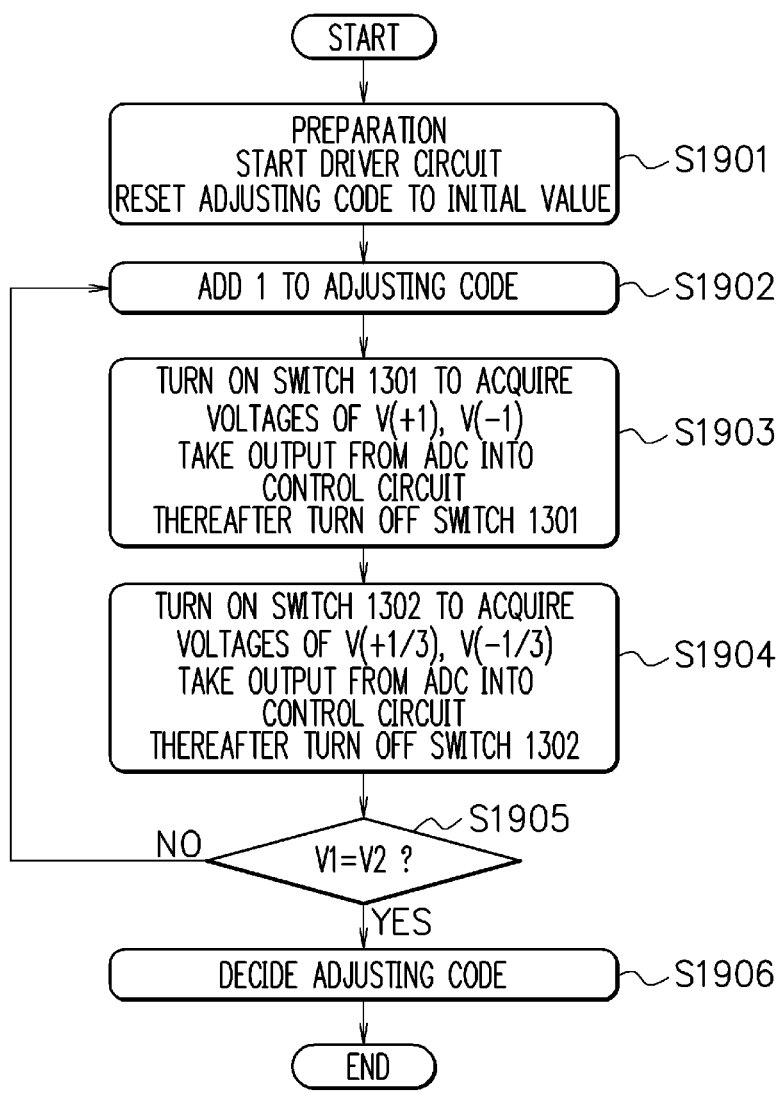

SIGNAL OUTPUT CIRCUIT, TRANSMISSION CIRCUIT AND INTEGRATED CIRCUIT

CROSS-REFERENCE TO RELATED APPLICATIONS

This application is based upon and claims the benefit of priority of the prior Japanese Patent Application No. 2018-123104, filed on Jun. 28, 2018, and the prior Japanese Patent Application No. 2018-021183, filed on Feb. 8, 2018, the entire contents of which are incorporated herein by reference.

FIELD

The embodiments discussed herein are directed to a signal output circuit, a transmission circuit, and an integrated circuit

BACKGROUND

There is a known transmission circuit including a driver circuit and a bias circuit (refer to Patent Document 1). The driver circuit includes a first transistor for adjusting an output impedance, and a switching circuit connected to the first transistor and for switching an output polarity for a differential output. The bias circuit includes a first replica circuit including a second transistor corresponding to the first transistor and generates such a gate voltage that the current and voltage characteristics of the first transistor correspond to the output impedance, and supplies the gate voltage to a gate of the first transistor.

Further, there is a known differential driver circuit that drives a transmission line pair so as to pass current through a terminating resistor connected between the transmission line pair (refer to Patent Document 2). The drive body includes a first current source transistor on the power supply side, a second current source transistor on the ground side, and a plurality of output switch transistors each connected between the first current source transistor and the second current source transistor and for controlling the current flowing through the terminating resistor via the transmission line pair. The replica circuit includes: a replica terminating resistor having a resistance value larger than the resistance value of the terminating resistor; and a plurality of replica transistors each having an on-resistance value larger than the on-resistance value of each of the plurality of output switch transistors, connected between the first current source transistor and the second current source transistor and for passing current through the replica terminating resistor to thereby generate a plus-side virtual potential and a minus-side virtual potential. A feedback circuit controls the first current source transistor according to the plus-side virtual potential and controls the second current source transistor according to the minus-side virtual potential so that a plus-side potential and a minus-side potential of the transmission line pair become predetermined potentials respectively.

Further, there is a known output driver including a first pair of stacked metal oxide semiconductor field-effect transistor (MOS) devices, and a second pair of stacked MOS devices (refer to Patent Document 3). The first pair of stacked MOS devices are coupled between a power terminal and a first differential output terminal. The second pair of stacked MOS devices are coupled between a second differential output terminal and a ground terminal.

Further, there is a known current driver that passes current through a terminating resistor connected between a transmission path pair to thereby drive the transmission path pair (refer to Patent Document 4). An output circuit is supplied with plus and minus controls signals to output a differential signal to the transmission path pair. A first current source circuit is connected between a first power supply and the output circuit. A second current source circuit is connected between the output circuit and a second power supply. A current source control circuit controls both the first current source circuit and the second current source circuit referring to a common mode voltage being an intermediate voltage of the differential signal.

[Patent Document 1] International Publication Pamphlet No. WO 2016/035192

[Patent Document 2] International Publication Pamphlet No. WO 2012/117456

[Patent Document 3] Japanese National Publication of International Patent Application No. 2016-502307

[Patent Document 4] Japanese Laid-open Patent Publication No. 2009-038546

The driver circuit can output a plurality of signal levels. However, the plurality of signal levels are likely to vary.

SUMMARY

A signal output circuit includes: a driver circuit including a variable current source and configured to output a multilevel signal; a replica circuit having a circuit configuration equivalent to the driver circuit; and a control circuit configured to control a characteristic of the driver circuit, based on an output signal of the replica circuit, wherein the replica circuit includes: a first replica circuit part configured to output first output signals having signal levels of a first subset of a plurality of signal levels corresponding to the multilevel signal; and a second replica circuit part configured to output second output signals having signal levels of a second subset of the plurality of signal levels, and the control circuit is configured to control a characteristic of the variable current source, based on the first output signals and the second output signals.

Further, a signal output circuit includes: a driver circuit including a variable current source and configured to output a multilevel signal; a first detection circuit configured to detect signal levels of a first subset of a plurality of signal levels corresponding to the multilevel signal outputted from the driver circuit; a second detection circuit configured to detect signal levels of a second subset of the plurality of signal levels corresponding to the multilevel signal outputted from the driver circuit; and a control circuit configured to control a characteristic of the driver circuit, based on the signal levels of the first subset and the signal levels of the second subset, wherein the control circuit is configured to control a characteristic of the variable current source, based on the signal levels of the first subset and the signal levels of the second subset.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3A and FIG. 3B are diagrams illustrating a configuration example of the signal output circuit;

FIG. 4A and FIG. 4B are diagrams illustrating a configuration example of the signal output circuit;

FIG. 5A is a diagram illustrating the signal output circuit that controls values of resistors and thereby adjusts signal levels, and FIG. 5B is a graph illustrating an example of the relation between code adjustment amounts of the resistors and an RLM;

FIG. 6A is a diagram illustrating a configuration example of a driver circuit according to a first embodiment, and FIG. 6B is a graph illustrating an example of the relation between the current of a variable current source and the RLM;

FIG. 11 is a diagram illustrating a configuration example of a comparison circuit according to a fourth embodiment;

FIG. 18 is a diagram illustrating a configuration example of a signal output circuit according to an eighth embodiment; and FIG. 19 is a flowchart illustrating a control method of an integrated circuit according to the eighth embodiment.

DESCRIPTION OF EMBODIMENTS

First Embodiment

Figure 1:
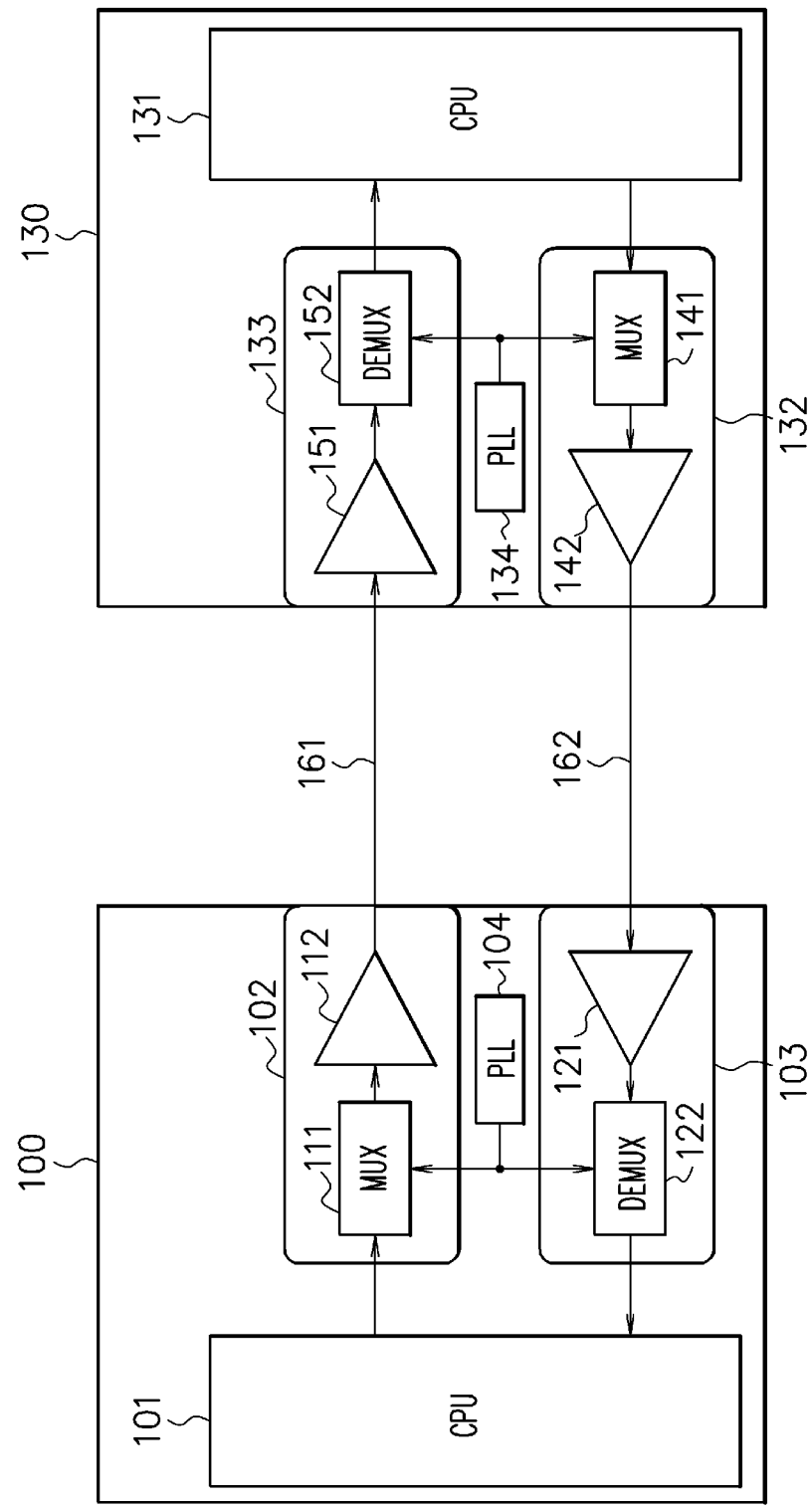
FIG. 1 is a diagram illustrating a configuration example of integrated circuits according to a first embodiment.

FIG. 1 is a diagram illustrating a configuration example of integrated circuits 100 and 130 according to a first embodiment. The integrated circuits 100 and 130 mutually connected by transmission channels 161 and 162. The integrated circuit 100 includes a central processing unit (CPU) 10, a transmission circuit 102, a reception circuit 103, and a phase-locked loop (PLL) circuit 104. The central processing unit 101 is an internal circuit, and generates internal data and outputs parallel internal data to the transmission circuit 102.

The transmission circuit 102 includes a multiplexer 111 and a signal output circuit 112. The multiplexer 111 receives input of the parallel data of a first number of bits generated by the central processing unit 101, and multiplexes the parallel data of the first number of bits into parallel data of a second number of bits smaller than the first number of bits. For example, the multiplexer 111 multiplexes parallel data of 16 bits into parallel data of 2 bits in synchronization with a clock signal generated by the phase-locked loop circuit 104, and outputs the parallel data of 2 bits to the signal output circuit 112. The signal output circuit 112 transmits a quaternary signal corresponding to the parallel data of 2 bits to the integrated circuit 130 via the transmission channel 161. Note that the signal output circuit 112 can receive input of parallel data of 2 bits or more and output a multilevel signal. The multilevel signal is a ternary or higher signal.

The reception circuit 103 includes a decision feedback equalizer (DFE) 121 and a demultiplexer 122. The DFE 121 receives the quaternary signal (multilevel signal) from the integrated circuit 130 via the transmission channel 162, and performs equalization and quaternary decision on the received quaternary signal, and outputs parallel data of 2 bits. The demultiplexer 122 demultiplexes the parallel data of 2 bits outputted from the DFE 121 into, for example, parallel data of 16 bits in synchronization with the clock signal generated by the phase-locked loop circuit 104, and outputs, for example, the parallel data of 16 bits to the central processing unit 101. The central processing unit 101 performs processing of, for example, the parallel data of 16 bits.

The integrated circuit 130 includes, as with the integrated circuit 100, a central processing unit 131, a transmission circuit 132, a reception circuit 133, and a phase-locked loop circuit 134. The transmission circuit 132 includes, as with the above transmission circuit 102, a multiplexer 141 and a signal output circuit 142, and transmits a quaternary signal to the integrated circuit 100 via the transmission channel 162. The reception circuit 133 includes, as with the above reception circuit 103, a DFE 151 and a demultiplexer 152, and receives the quaternary signal from the integrated circuit 100 via the transmission channel 161. The processing of the integrated circuit 130 is the same as the processing of the above integrated circuit 100.

Figure 2A:
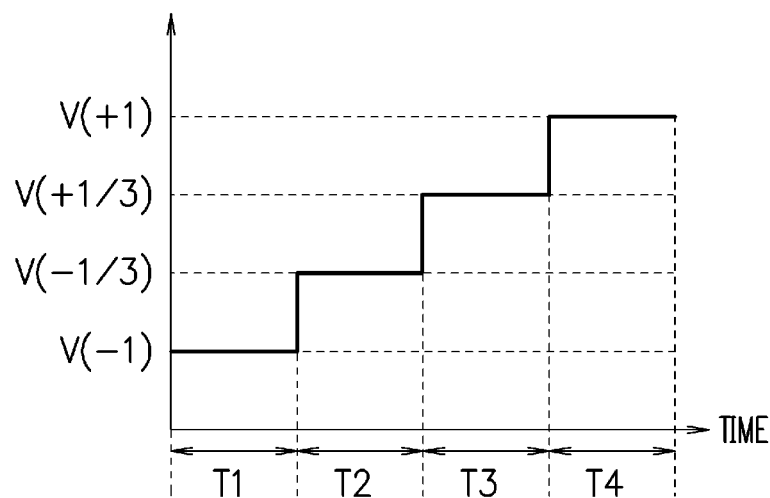
FIG. 2A is a voltage waveform chart illustrating an example of a quaternary signal outputted from a signal output circuit.

FIG. 2A is a voltage waveform chart illustrating an example of the quaternary signal outputted from the signal output circuit 112 in FIG. 1. Hereinafter, the signal output circuit 112 will be described as an example, and the signal output circuit 142 is the same as the signal output circuit 112. The signal output circuit 112 receives input of 2-bit parallel data and outputs a quaternary signal. In a period T1, the signal output circuit 112 outputs a signal level V(−1) corresponding to a 2-bit parallel data "00". In a period T2, the signal output circuit 112 outputs a signal level V(−⅓) corresponding to a 2-bit parallel data "01". In a period T3, the signal output circuit 112 outputs a signal level V(+⅓) corresponding to a 2-bit parallel data "10". In a period T4, the signal output circuit 112 outputs a signal level V(+1) corresponding to a 2-bit parallel data "11".

Figure 2B:
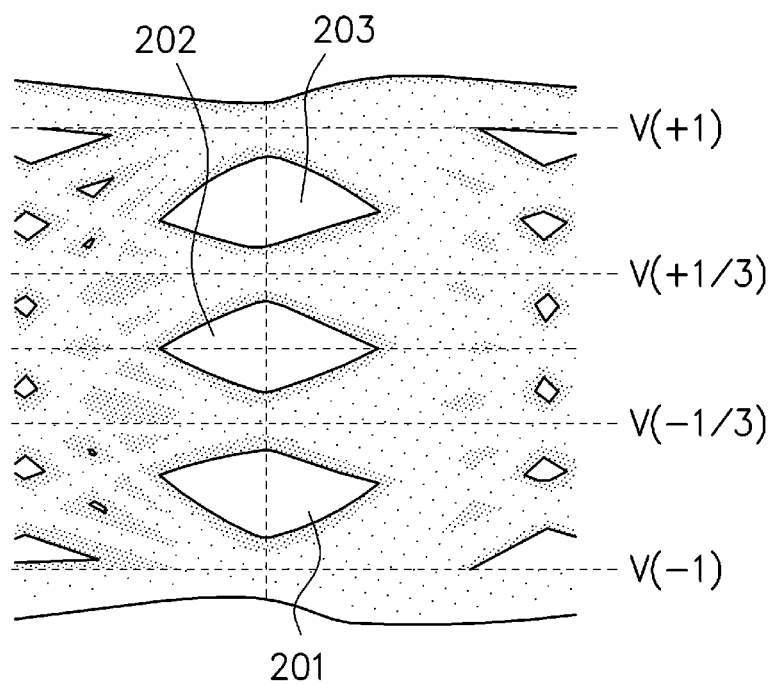
FIG. 2B is a chart illustrating an example of a voltage waveform made by overlapping various transition patterns of the quaternary signal with respect to time.

FIG. 2B is a chart illustrating an example of a voltage waveform made by overlapping various transition patterns of the quaternary signal with respect to time. The quaternary signal changes in voltage waveform according to a past signal level. An eye pattern 201 is an eye pattern formed between the signal levels V(−1) and V(−⅓). An eye pattern 202 is an eye pattern formed between the signal levels V(−⅓) and V(+⅓). An eye pattern 203 is an eye pattern formed between the signal levels V(+⅓) and V(+1).

Ideally, the signal levels V(−1), V(−⅓), V(+⅓) and V(+1) are voltage values at regular intervals from each other. A difference between the signal levels V(+1) and V(+⅓), a difference between the signal levels V(+⅓) and V(−⅓), and a difference between the signal levels V(−⅓) and V(−1) are each ⅓ of a difference between the signal levels V(+1) and V(−1), and mutually the same.

Next, an RLM (Level Separation Mismatch Ratio) will be described. The RLM is expressed by the following expressions.

$$Vmid=\{V(-1)+V(+1)\}/2$$

$$ES1=\{V(-⅓)-Vmid\}/\{V(-1)-Vmid\}$$

$$ES2=\{V(+⅓)-Vmid\}/\{V(+1)-Vmid\}$$

$$RLM=\min\{(3·ES1),(3·ES2),(2-3·ES1),(2-3·ES2)\}$$

The RLM is the minimum value among a value of (3·ES1), a value of (3·ES2), a value of (2−3·ES1), and a value of (2−3·ES2). The RLM indicates the good balance among the three eye patterns 201 to 203. In the case where all of amplitudes of the three eye patterns 201 to 203 are the same, the RLM is 1. The signal output circuit 112 requires, for example, an RLM of 0.95 or more. By improving the RLM, the quality of the quaternary signal to be transmitted is improved, thus allowing the reception circuit 133 to reduce the reproduction error of the quaternary signal. To improve the RLM, the signal output circuit 112 performs adjustment so that the signal levels V(−1), V(−⅓), V(+⅓), and V(+1) become voltage values at regular intervals from each other.

FIG. 3A and FIG. 3B and FIG. 4A and FIG. 4B are diagrams illustrating a configuration example of the signal output circuit 112. The signal output circuit 112 includes a driver circuit 300 and is connected to the DFE 151 in FIG. 1. The DFE 151 includes a resistor 331 of 50Ω and a resistor 332 of 50Ω. The resistors 331 and 332 are connected in series between a node N1 and a node N2.

The driver circuit 300 includes resistors 301 to 304 of 150Ω, resistors 305 to 308 of 75Ω, p-channel field-effect transistors (switches) 311 to 314, and n-channel field-effect transistors (switches) 321 to 324.

The p-channel field-effect transistor 311 and the resistor 301 are connected in series between a power supply potential node and the node N1. The p-channel field-effect transistor 312 and the resistor 305 are connected in series between the power supply potential node and the node N1. The resistor 302 and the n-channel field-effect transistor 321 are connected in series between the node N1 and a reference potential node (ground potential node). The resistor 306 and the n-channel field-effect transistor 322 are connected in series between the node N1 and the reference potential node.

The p-channel field-effect transistor 313 and the resistor 303 are connected in series between the power supply potential node and a node N2. The p-channel field-effect transistor 314 and the resistor 307 are connected in series between the power supply potential node and the node N2. The resistor 304 and the n-channel field-effect transistor 323 are connected in series between the node N2 and the reference potential node. The resistor 308 and the n-channel field-effect transistor 324 are connected in series between the node N2 and the reference potential node.

FIG. 3A is a diagram illustrating the signal output circuit 112 that outputs the signal level V(+1) from the node N1. When the 2-bit parallel data "11" is inputted, the signal output circuit 112 outputs the signal level V(+1) from the node N1 and outputs the signal level V(−1) from the node N2. When the 2-bit parallel data "11" is inputted, the p-channel field-effect transistors 311 and 312 are turned on, the n-channel field-effect transistors 321 and 322 are turned off, the p-channel field-effect transistors 313 and 314 are turned off, and the n-channel field-effect transistors 323 and 324 are turned on. A combined resistance of the resistor of 150Ω and the resistor of 75Ω connected in parallel is 50Ω. The node N1 becomes the signal level V(+1). The node N2 becomes the signal level V(−1).

FIG. 3B is a diagram illustrating the signal output circuit 112 that outputs the signal level V(+⅓) from the node N1. When the 2-bit parallel data "10" is inputted, the signal output circuit 112 outputs the signal level V(+⅓) from the node N1 and outputs the signal level V(−⅓) from the node N2. When the 2-bit parallel data "10" is inputted, the p-channel field-effect transistors 312 and 313 are turned on, the n-channel field-effect transistors 321 and 324 are turned on, the p-channel field-effect transistors 311 and 314 are turned off, and the n-channel field-effect transistors 322 and 323 are turned off. The node N1 becomes the signal level V(+⅓). The node N2 becomes the signal level V(−⅓).

FIG. 4A is a diagram illustrating the signal output circuit 112 that outputs the signal level V(−⅓) from the node N1. When the 2-bit parallel data "01" is inputted, the signal output circuit 112 outputs the signal level V(−⅓) from the node N1 and outputs the signal level V(+⅓) from the node N2. When the 2-bit parallel data "01" is inputted, the p-channel field-effect transistors 311 and 314 are turned on, the n-channel field-effect transistors 322 and 323 are turned on, the p-channel field-effect transistors 312 and 313 are turned off, and the n-channel field-effect transistors 321 and 324 are turned off. The node N1 becomes the signal level V(−⅓). The node N2 becomes the signal level V(+⅓).

FIG. 4B is a diagram illustrating the signal output circuit 112 that outputs the signal level V(−1) from the node N1. When the 2-bit parallel data "00" is inputted, the signal output circuit 112 outputs the signal level V(−1) from the node N1 and outputs the signal level V(+1) from the node N2. When the 2-bit parallel data "00" is inputted, the p-channel field-effect transistors 313 and 314 are turned on, the n-channel field-effect transistors 321 and 322 are turned on, the p-channel field-effect transistors 311 and 312 are turned off, and the n-channel field-effect transistors 323 and 324 are turned off. A combined resistance of the resistor of 150Ω and the resistor of 75Ω connected in parallel is 50Ω. The node N1 becomes the signal level V(−1). The node N2 becomes the signal level V(+1).

Here, the signal levels V(−1), V(−⅓), V(+⅓), and V(+1) fluctuate due to the causes such as the variation in the resistors 301 to 308 and the nonlinear characteristics of the field-effect transistors 311 to 314, 321 to 324, resulting in a decrease in RLM.

FIG. 5A is a diagram illustrating the signal output circuit 112 that controls the values of the resistors 301 to 308 and thereby adjusts the signal levels V(−1), V(−⅓), V(+⅓), and V(+1). The resistors 301 to 308 are variable resistors. The signal output circuit 112 controls the values of the resistors 301 to 308 and thereby can adjust the signal levels V(−1), V(−⅓), V(+⅓), and V(+1).

FIG. 5B is a graph illustrating an example of the relation between code adjustment amounts of the resistors 305 to 308 of 75Ω and the RLM. The signal output circuit 112 controls the values of the resistors 305 to 308 of 75Ω by the adjustment amounts and thereby can adjust the RLM.

However, in the case of making the variable resolution of the resistors 301 to 308 finer, the number of switchable resistors in each of the resistors 301 to 308 increases, resulting in an increase in the area of each of the resistors 301 to 308. If there is a limit in area, it is difficult to make the RLM, for example, to 0.95 or more.

FIG. 6A is a diagram illustrating a configuration example of a driver circuit 300a according to a first embodiment. The signal output circuit 112 includes the driver circuit 300a. The driver circuit 300a is made by adding variable current sources 341 to 344 to the driver circuit 300 in FIG. 3A. The variable current source 341 is connected between the power supply potential node and the node N1. The variable current source 342 is connected between the node N1 and the reference potential node. The variable current source 343 is connected between the power supply potential node and the node N2. The variable current source 344 is connected between the node N2 and the reference potential node. Each of the variable current sources 341 to 344 controls the number of transistors constituting a current mirror and thereby can change the current. Therefore, the variable current sources 341 to 344 can easily adjust the adjustment range of the RLM and the resolution, and can suppress the increase in area as compared with the variable resistor in FIG. 5A.

In the control state of FIG. 3A and FIG. 3B, the signal output circuit 112 controls the variable current sources 341 and 344 and thereby can control the currents flowing through the resistors 331 and 332 to control voltage drop amounts of the resistors 331 and 332. Thus, the signal output circuit 112 can control the signal levels V(+1) and V(+⅓) to adjust the RLM.

In the control state of FIG. 4A and FIG. 4B, the signal output circuit 112 controls the variable current sources 342 and 343 and thereby can control the currents flowing through the resistors 331 and 332 to control the voltage drop amounts of the resistors 331 and 332. Thus, the signal output circuit 112 controls the signal levels V(−⅓) and V(−1) and thereby can adjust the RLM.

FIG. 6B is a graph illustrating an example of the relation between the current of the variable current source 341 and the RLM. The signal output circuit 112 controls the variable current sources 341 to 344 and thereby can adjust the RLM.

Figure 7:
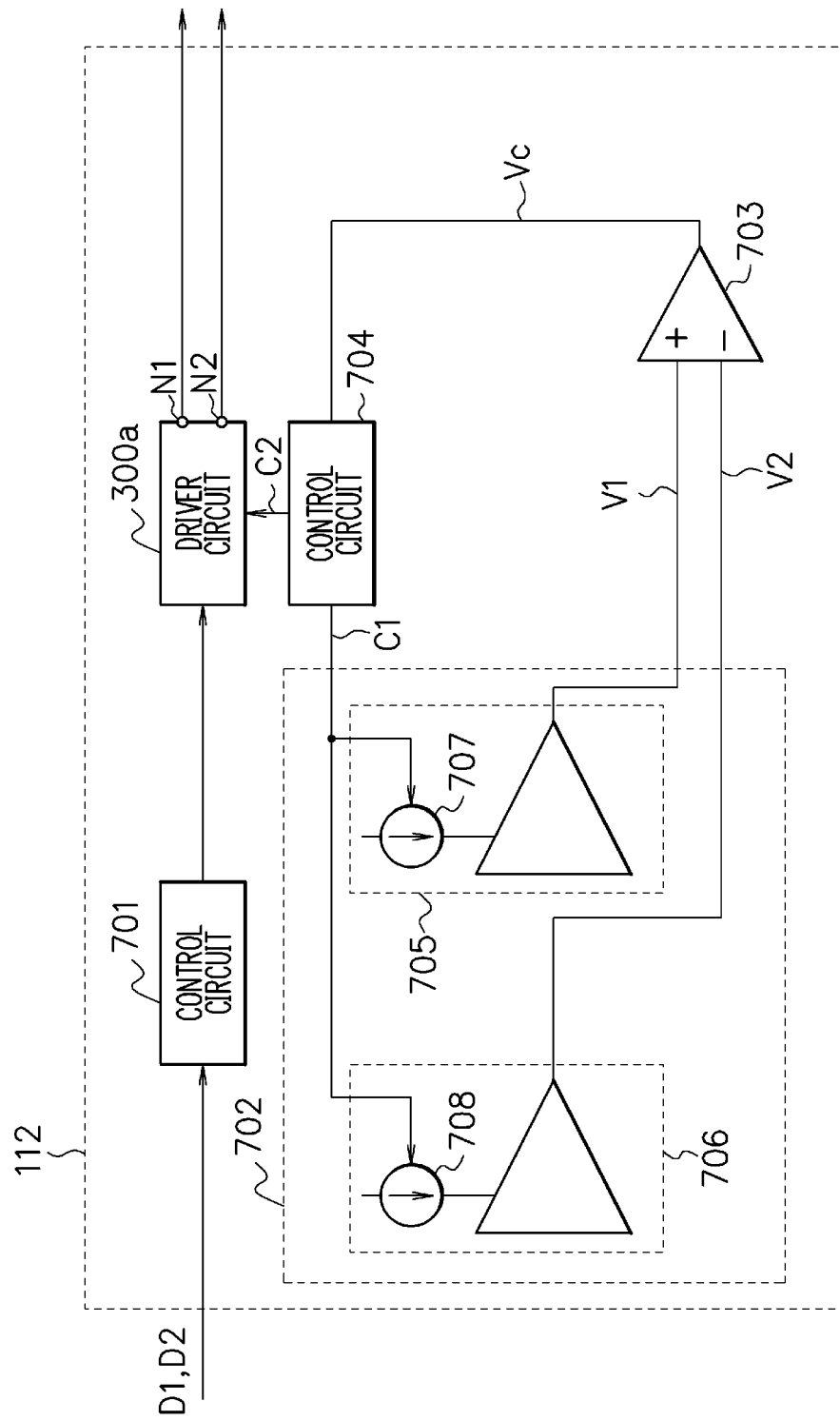
FIG. 7 is a diagram illustrating a configuration example of the signal output circuit according to the first embodiment.

FIG. 7 is a diagram illustrating a configuration example of the signal output circuit 112 according to the first embodiment. The signal output circuit 112 includes the driver circuit 300a, a control circuit 701, a replica circuit 702, a comparison circuit 703, and a control circuit 704. The control circuit 701 controls the field-effect transistors 311 to 314 and 321 to 324 as illustrated in FIG. 3A and FIG. 3B and FIG. 4A and FIG. 4B on the basis of 2-bit parallel data D1 and D2 inputted from the multiplexer 111 in FIG. 1. The driver circuit 300a has a configuration of the driver circuit 300a illustrated in FIG. 6A, and outputs the signal level V(−1), V(−⅓), V(+⅓), or V(+1) corresponding to the quaternary signal from the nodes N1 and N2.

The replica circuit 702 includes a first replica circuit part 705 and a second replica circuit part 706, and has a circuit configuration equivalent to the driver circuit 300a. The first replica circuit part 705 includes a variable current source 707. The second replica circuit part 706 includes a variable current source 708. The variable current sources 707 and 708 correspond to the variable current sources 341 to 344 of the driver circuit 300a in FIG. 6A.

The first replica circuit part 705 generates signal levels of a first subset of the four signal levels V(−1), V(−⅓), V(+⅓), and V(+1) corresponding to the quaternary signal. For example, the first replica circuit part 705 generates first subset signal levels V(−⅓) and V(+⅓).

The second replica circuit part 706 outputs signal levels of a second subset of the four signal levels V(−1), V(−⅓), V(+⅓), and V(+1) corresponding to the quaternary signal. For example, the second replica circuit part 706 generates second subset signal levels V(−1) and V(+1).

The comparison circuit 703 compares a signal level V1 and a signal level V2, and outputs a comparison result signal Vc. The signal level V1 is a first comparison object level based on the signal levels V(−⅓) and V(+⅓) generated by the first replica circuit part 705, and is expressed, for example, by the following expression.

$$V1 = V(+⅓) - V(-⅓)$$

The signal level V2 is a second comparison object level based on the signal levels V(−1) and V(+1) generated by the second replica circuit part 706, and is expressed, for example, by the following expression.

$$V2 = (V(+1) - V(-1)) \times ⅓$$

The control circuit 704 controls the currents of the variable current sources 707 and 708 by an adjusting code C1 so that the signal level V1 approaches the signal level V2 on the basis of the comparison result signal Vc. When the signal level V1 becomes the same as the signal level V2, the control circuit 704 fixes the adjusting code C1 and outputs an adjusting code C2 corresponding to the adjusting code C1 to the driver circuit 300a. The control circuit 704 controls the currents (characteristics) of the variable current sources 341 to 344 in the driver circuit 300a in FIG. 6A by the adjusting code C2. The variable current sources 341 to 344 in the driver circuit 300a are controlled in current by the adjusting code C2. Thus, the RLM of the quaternary signal outputted from the driver circuit 300a is adjusted to 0.95 or more. Note that details of the replica circuit 702 and the comparison circuit 703 will be described in later embodiments.

Figure 8:
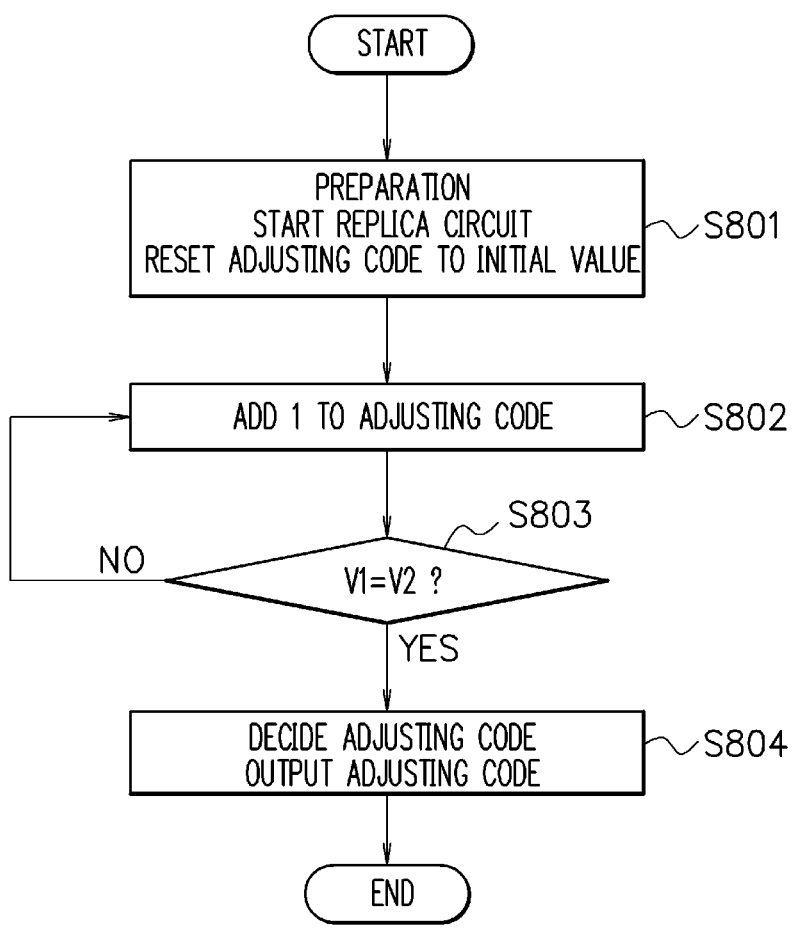
FIG. 8 is a flowchart illustrating a control method of the integrated circuit according to the first embodiment.

FIG. 8 is a flowchart illustrating a control method of the integrated circuit 100. At Step S801, the integrated circuit 100 performs preparation processing in a test mode. The integrated circuit 100 starts the replica circuit 702. The control circuit 704 resets the adjusting code C1 to an initial value, and outputs the adjusting code C1 of the initial value to the variable current sources 707 and 708. For example, the initial value of the adjusting code C1 is the minimum value. The variable current sources 707 and 708 pass the currents based on the adjusting code C1.

Next, at Step S802, the control circuit 704 adds 1 to the adjusting code C1, and outputs the adjusting code C1 after the addition to the variable current sources 707 and 708. The variable current sources 707 and 708 pass currents based on the adjusting code C1.

Next, at Step S803, the control circuit 704 determines whether or not the signal level V1 is the same as the signal level V2 on the basis of the comparison result signal Vc of the comparison circuit 703. When the signal level V1 is not the same as the signal level V2, the control circuit 704 returns to Step S802 and repeats the above-described processing. With an increase in adjusting code C1, the signal level V1 approaches the signal level V2. When determining that the signal level V1 is the same as the signal level V2, the control circuit 704 proceeds to Step S804.

At Step S804, the control circuit 704 decides the adjusting code C2 corresponding to the present adjusting code C1, outputs the adjusting code C2 to the variable current sources 341 to 344 in the driver circuit 300a, and ends the processing in the test mode. The integrated circuit 100 then performs processing in a normal mode. Each of the variable current sources 341 to 344 in the driver circuit 300a passes a current based on the adjusting code C2. The driver circuit 300a can output signal levels V(−1), V(−⅓), V(+⅓), and V(+1) which are the same as the signal levels V(−1), V(−⅓), V(+⅓), and V(+1) generated by the replica circuit 702.

The driver circuit 300a can output the signal levels V(−1), V(−⅓), V(+⅓), and V(+1) at regular intervals from each other on the basis of the adjusting code C2. Thus, the RLM of the quaternary signal outputted from the driver circuit 300a is improved. Improving the RLM improves the quality of the quaternary signal, thus allowing the reception circuit 133 to reduce the reproduction error of the quaternary signal.

Second Embodiment

Figure 9:
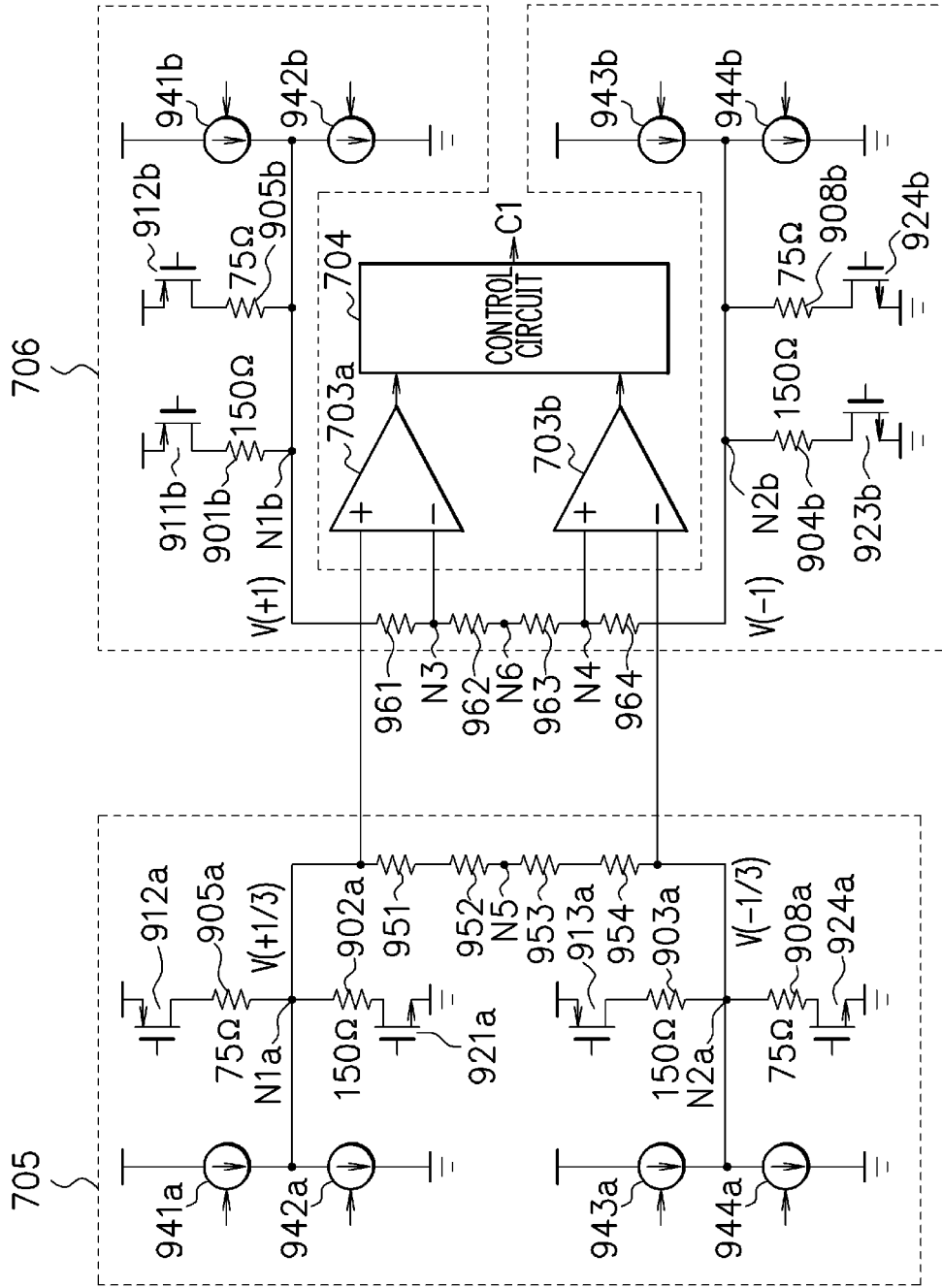
FIG. 9 is a diagram illustrating a configuration example of a part of a signal output circuit according to a second embodiment.

FIG. 9 is a diagram illustrating a configuration example of a first replica circuit part 705, a second replica circuit part 706, comparison circuits 703a, 703b and a control circuit 704 according to a second embodiment. The comparison circuits 703a, 703b correspond to the comparison circuit 703 in FIG. 7. Hereinafter, points of the second embodiment different from the first embodiment will be described.

The first replica circuit part 705 includes resistors 905a, 902a, 903a, 908a, 951 to 954, p-channel field-effect transistors (switches) 912a, 913a, n-channel field-effect transistors (switches) 921a, 924a, and variable current sources 941a to 944a.

The variable current source 941a corresponds to the variable current source 341 of the driver circuit 300a in FIG. 6A and is connected between a power supply potential node and a node N1a. The variable current source 942a corresponds to the variable current source 342 of the driver circuit 300a in FIG. 6A and is connected between the node N1a and a reference potential node.

The p-channel field-effect transistor 912a and the resistor 905a are connected in series between the power supply potential node and the node N1a. The p-channel field-effect transistor 912a corresponds to the p-channel field-effect transistor 312 of the driver circuit 300a in FIG. 6A. The resistor 905a of 75Ω corresponds to the resistor 305 of 75Ω of the driver circuit 300a in FIG. 6A.

The resistor 902a and the n-channel field-effect transistor 921a are connected in series between the node N1a and the reference potential node. The resistor 902a of 150Ω corresponds to the resistor 302 of 150Ω of the driver circuit 300a in FIG. 6A. The n-channel field-effect transistor 921a corresponds to the n-channel field-effect transistor 321 of the driver circuit 300a in FIG. 6A.

The variable current source 943a corresponds to the variable current source 343 of the driver circuit 300a in FIG. 6A and is connected between the power supply potential node and a node N2a. The variable current source 944a corresponds to the variable current source 344 of the driver circuit 300a in FIG. 6A and is connected between the node N2a and the reference potential node.

The p-channel field-effect transistor 913a and the resistor 903a are connected in series between the power supply potential node and the node N2a. The p-channel field-effect transistor 913a corresponds to the p-channel field-effect transistor 313 of the driver circuit 300a in FIG. 6A. The resistor 903a of 150Ω corresponds to the resistor 303 of 150Ω of the driver circuit 300a in FIG. 6A.

The resistor 908a and the n-channel field-effect transistor 924a are connected in series between the node N2a and the reference potential node. The resistor 908a of 75Ω corresponds to the resistor 308 of 75Ω of the driver circuit 300a in FIG. 6A. The n-channel field-effect transistor 924a corresponds to the n-channel field-effect transistor 324 of the driver circuit 300a in FIG. 6A.

The resistor 951 and the resistor 952 are connected in series between the node N1a and a node N5. The node N5 is a common voltage node. The resistor 951 is (50×⅔) Ω. The resistor 952 is (50×⅓) Ω. A combined resistance of the resistors 951 and 952 connected in series is 50Ω. The resistors 951 and 952 correspond to the resistor 331 in FIG. 6A.

The resistor 953 and the resistor 954 are connected in series between the node N5 and the node N2a. The resistor 953 is (50×⅓) Ω. The resistor 954 is (50×⅔) Ω. A combined resistance of the resistors 953 and 954 connected in series is Ω. The resistors 953 and 954 correspond to the resistor 332 in FIG. 6A.

The first replica circuit part 705 outputs the signal level V(+⅓) from the node N1a and outputs the signal level V(−⅓) from the node N2a as in FIG. 3B.

The second replica circuit part 706 includes resistors 901b, 905b, 904b, 908b, 961 to 964, p-channel field-effect transistors (switches) 911b, 912b, n-channel field-effect transistors (switches) 923b, 924b, and variable current sources 941b to 944b.

The variable current source 941b corresponds to the variable current source 341 of the driver circuit 300a in FIG. 6A and is connected between the power supply potential node and a node N1b. The variable current source 942b corresponds to the variable current source 342 of the driver circuit 300a in FIG. 6A and is connected between the node N1b and the reference potential node.

The p-channel field-effect transistor 911b and the resistor 901b are connected in series between the power supply potential node and the node N1b. The p-channel field-effect transistor 911b corresponds to the p-channel field-effect transistor 311 of the driver circuit 300a in FIG. 6A. The resistor 901b of 150Ω corresponds to the resistor 301 of 150Ω of the driver circuit 300a in FIG. 6A.

The p-channel field-effect transistor 912b and the resistor 905b are connected in series between the power supply potential node and the node N1b. The p-channel field-effect transistor 912b corresponds to the p-channel field-effect transistor 312 of the driver circuit 300a in FIG. 6A. The resistor 905b of 75Ω corresponds to the resistor 305 of 75Ω of the driver circuit 300a in FIG. 6A.

The variable current source 943b corresponds to the variable current source 343 of the driver circuit 300a in FIG. 6A and is connected between the power supply potential node and a node N2b. The variable current source 944b corresponds to the variable current source 344 of the driver circuit 300a in FIG. 6A and is connected between the node N2b and the reference potential node.

The resistor 904b and the n-channel field-effect transistor 923b are connected in series between the node N2b and the reference potential node. The resistor 904b of 150Ω corresponds to the resistor 304 of 150Ω of the driver circuit 300a in FIG. 6A. The n-channel field-effect transistor 923b corresponds to the n-channel field-effect transistor 323 of the driver circuit 300a in FIG. 6A.

The resistor 908b and the n-channel field-effect transistor 924b are connected in series between the node N2b and the reference potential node. The resistor 908b of 75Ω corresponds to the resistor 308 of 75Ω of the driver circuit 300a in FIG. 6A. The n-channel field-effect transistor 924b corresponds to the n-channel field-effect transistor 324 of the driver circuit 300a in FIG. 6A.

The resistor 961 is (50×⅔) Ω and is connected between the node N1b and a node N3. The resistor 962 is (50×⅓) Ω and is connected between the node N3 and a node N6. The node N6 is a common voltage node. A combined resistance of the resistors 961 and 962 connected in series is 50Ω. The resistors 961 and 962 correspond to the resistor 331 in FIG. 6A.

The resistor 963 is (50×⅓) Ω and connected between the node N6 and the node N4. The resistor 964 is (50×⅔) Ω and connected between the node N4 and the node N2b. A combined resistance of the resistors 963 and 964 connected in series is 50Ω. The resistors 963 and 964 correspond to the resistor 332 in FIG. 6A. A value of a combined resistance of the resistors 961 to 964 is the same as a value of a combined resistance of the resistors 951 to 954.

In the second replica circuit part 706, as in FIG. 3A, the node N1b becomes the signal level V(+1) and the node N2b becomes the signal level V(−1). The voltage between the node N4 and the node N2b is a voltage of ⅓ of the difference between the signal level V(+1) of the node N1b and the signal level V(−1) of the node N2b. Accordingly, the node N4 outputs a signal level made by adding ⅓ of the difference between the signal level V(+1) of the node N1b and the signal level V(−1) of the node N2b to the signal level V(−1) of the node N2b. The signal level of the node N4 corresponds to the signal level V(−⅓).

The comparison circuit 703b compares the signal level V(−⅓) outputted from the node N2a of the first replica circuit part 705 and the signal level V(−⅓) outputted from the node N4 of the second replica circuit part 706, and outputs a comparison result signal to the control circuit 704.

The voltage between the node N1b and the node N3 is a voltage of ⅓ of the difference between the signal level V(+1) of the node N1b and the signal level V(−1) of the node N2b. Accordingly, the node N3 outputs a signal level made by subtracting ⅓ of the difference between the signal level V(+1) of the node N1b and the signal level V(−1) of the node N2b from the signal level V(+1) of the node N1b. The signal level of the node N3 corresponds to the signal level V(+⅓).

The comparison circuit 703a compares the signal level V(+⅓) outputted from the node N1a of the first replica circuit part 705 and the signal level V(+⅓) outputted from the node N3 of the second replica circuit part 706, and outputs a comparison result signal to the control circuit 704.

The control circuit 704 controls the currents of the variable current sources 941a to 944a and 941b to 944b by an adjusting code C1 on the basis of the comparison result signals of the comparison circuits 703a and 703b so that the signal level V(−⅓) of the node N2a approaches the signal level V(−⅓) of the node N4 and the signal level V(+⅓) of the node N1a approaches the signal level V(+⅓) of the node N3.

When both the comparison result signals of the comparison circuits 703a and 703b indicate coincidence, the control circuit 704 fixes the adjusting code C1 and outputs an adjusting code C2 corresponding to the adjusting code C1 to the driver circuit 300a. The control circuit 704 controls the currents of the variable current sources 341 to 344 in the driver circuit 300a in FIG. 6A by the adjusting code C2. Thus, the RLM of the quaternary signal outputted from the driver circuit 300a is adjusted to 0.95 or more.

Third Embodiment

Figure 10:
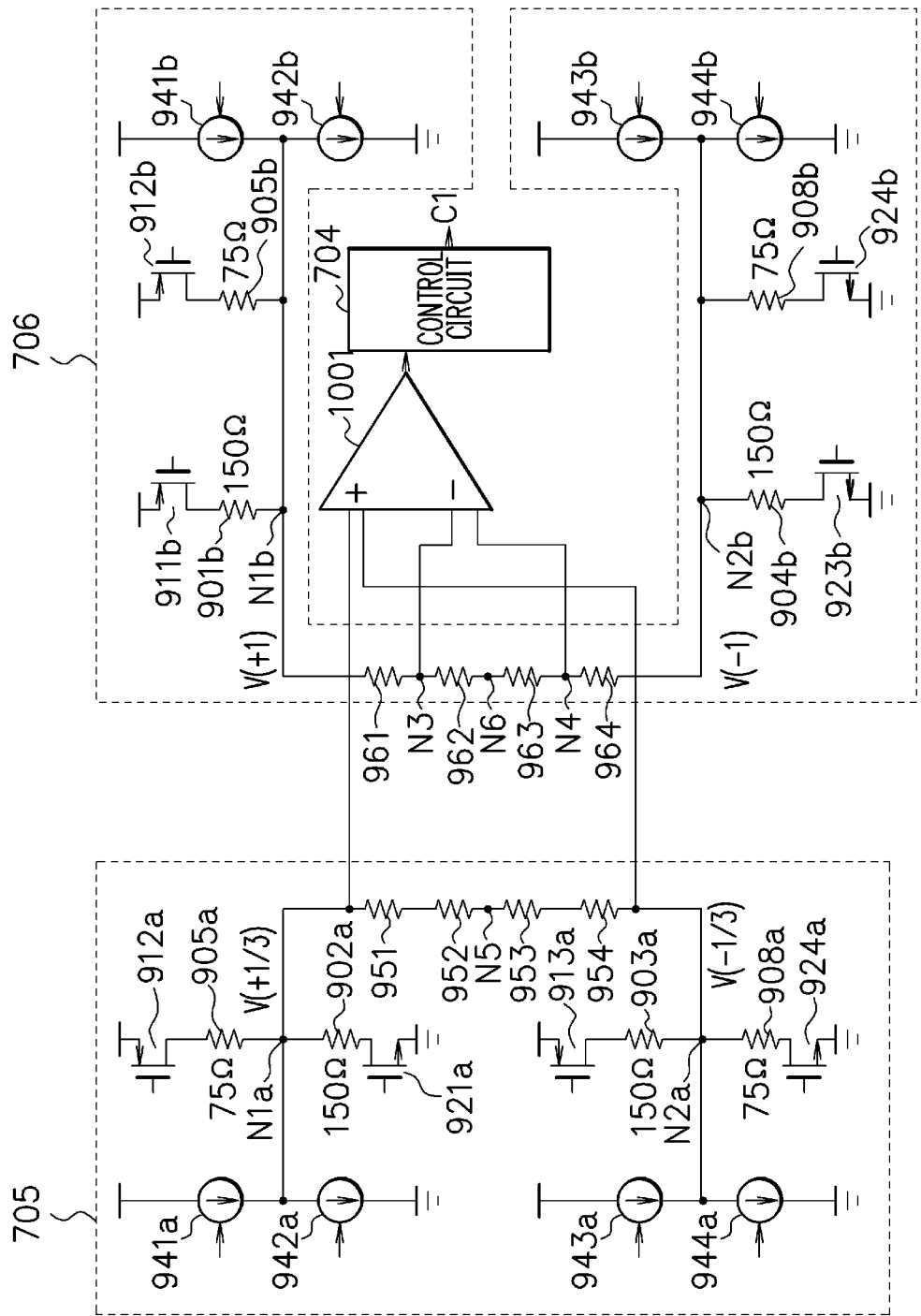
FIG. 10 is a diagram illustrating a configuration example of a part of a signal output circuit according to a third embodiment.

FIG. 10 is a diagram illustrating a configuration example of a first replica circuit part 705, a second replica circuit part 706, a comparison circuit 1001 and a control circuit 704 according to a third embodiment. The comparison circuit 1001 corresponds to the comparison circuit 703 in FIG. 7. FIG. 10 illustrates the configuration made by providing the comparison circuit 1001 in place of the comparison circuits 703a and 703b with respect to that in FIG. 9. Hereinafter, points of the third embodiment different from the second embodiment will be described.

The comparison circuit 1001 compares the difference between the signal level V(+⅓) of the node N1a and the signal level V(−⅓) of the node N2b of the first replica circuit part 705 and the difference between the signal level V(+⅓) of the node N3 and the signal level V(−⅓) of the node N4 of the second replica circuit part 706, and outputs a comparison result signal to the control circuit 704. Here, the level difference between the signal level V(+⅓) of the node N3 and the signal level V(−⅓) of the node N4 of the second replica circuit part 706 becomes a voltage of ⅓ of the level difference between the signal level V(+1) of the node N1b and the signal level V(−1) of the node N2b.

The control circuit 704 controls the currents of the variable current sources 941a to 944a and 941b to 944b by an adjusting code C1 on the basis of the comparison result signal of the comparison circuit 1001 so that the difference between the signal level V(+⅓) of the node N1a and the signal level V(−⅓) of the node N2a approaches the difference between the signal level V(+⅓) of the node N3 and the signal level V(−⅓) of the node N4.

When the comparison result signal of the comparison circuit 1001 indicates coincidence, the control circuit 704 fixes the adjusting code C1 and outputs an adjusting code C2 corresponding to the adjusting code C1 to the driver circuit 300a. The control circuit 704 controls the currents of the variable current sources 341 to 344 in the driver circuit 300a in FIG. 6A by the adjusting code C2. Thus, the RLM of the quaternary signal outputted from the driver circuit 300a is adjusted to 0.95 or more.

The signal output circuit 112 in FIG. 9 decreases in adjustment accuracy of the RLM in some cases when the common voltage of the node N5 and the common voltage of the node N6 are displaced. According to this embodiment, the comparison circuit 1001 compares the difference between the signal levels of the nodes N1a and N2a and the difference between the signal levels of the nodes N3 and N4, so that the signal output circuit 112 can adjust the RLM with high accuracy even when the common voltage of the node N5 and the common voltage of the node N6 are displaced.

Fourth Embodiment

FIG. 11 is a diagram illustrating a configuration example of a comparison circuit 1100 according to a fourth embodiment. The comparison circuit 1100 corresponds to the comparison circuit 703 in FIG. 7. The comparison circuit 1100 is provided in place of the comparison circuit 1001 in the signal output circuit 112 of the third embodiment (FIG. 10). Hereinafter, points of the fourth embodiment different from the third embodiment will be described.

The comparison circuit 1100 includes resistors 1101, 1102, n-channel field-effect transistors 1103 to 1106, a current source 1107, and a comparator 1108. The resistor 1101 is connected between the power supply potential node and a node N7. The n-channel field-effect transistor 1103 has a drain connected to the node N7, a gate connected to a node N1a, and a source connected to a node N9. The n-channel field-effect transistor 1104 has a drain connected to the node N7, a gate connected to a node N4, and a source connected to the node N9.

The resistor 1102 is connected between the power supply potential node and a node N8. The re-channel field-effect transistor 1105 has a drain connected to the node N8, a gate connected to a node N2a, and a source connected to the node N9. The re-channel field-effect transistor 1106 has a drain connected to the node N8, a gate connected to the node N3, and a source connected to the node N9. The current source 1107 is connected between the node N9 and a reference potential node.

The node N1a is the node N1a of the first replica circuit part 705 and outputs the signal level V(+⅓). The node N2a is the node N2a of the first replica circuit part 705 and outputs the signal level V(−⅓). The node N3 is the node N3 of the second replica circuit part 706 and outputs the signal level V(+⅓). The node N4 is the node N4 of the second replica circuit part 706 and outputs the signal level V(−⅓).

The node N7 outputs a signal level of a sum of the signal level V(+⅓) of the node N1a and the signal level V(−⅓) of the node N4. The node N8 outputs a signal level of a sum of the signal level V(−⅓) of the node N2a and the signal level V(+⅓) of the node N3.

The comparator 1108 compares the signal level of the node N7 and the signal level of the node N8, and outputs a comparison result signal to the control circuit 704 in FIG. 10. The control circuit 704 controls the currents of the variable current sources 941a to 944a and 941b to 944b by an adjusting code C1 on the basis of the comparison result signal of the comparator 1108 so that the signal level of the node N7 approaches the signal level of the node N8.

When the comparison result signal of the comparator 1108 indicates coincidence, the control circuit 704 fixes the adjusting code C1 and outputs an adjusting code C2 corresponding to the adjusting code C1 to the driver circuit 300a. The control circuit 704 controls the currents of the variable current sources 341 to 344 in the driver circuit 300a in FIG. 6A by the adjusting code C2. Thus, the RLM of the quaternary signal outputted from the driver circuit 300a is adjusted to 0.95 or more.

Fifth Embodiment

Figure 12:
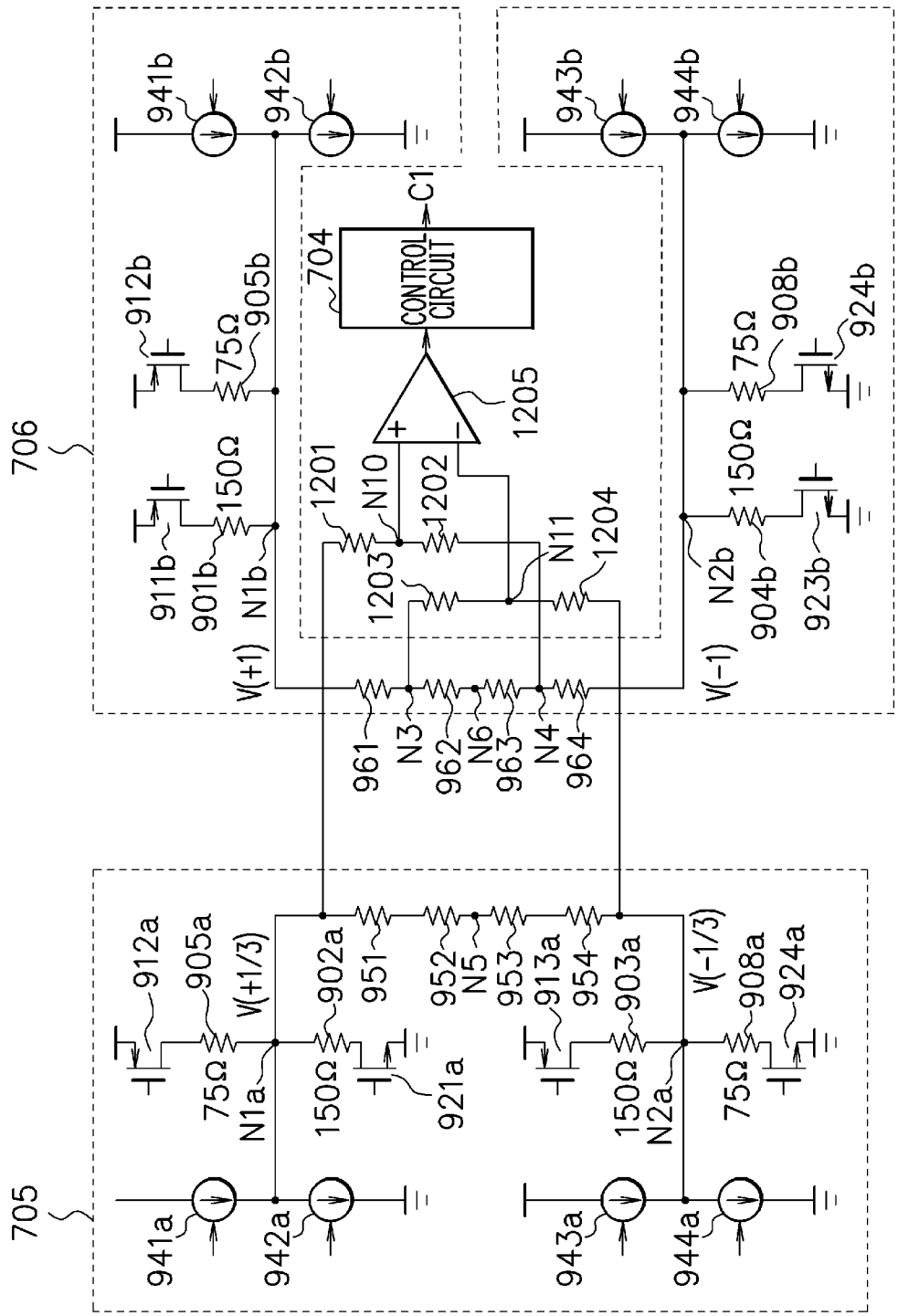
FIG. 12 is a diagram illustrating a configuration example of a part of a signal output circuit according to a fifth embodiment.

FIG. 12 is a diagram illustrating a configuration example of a first replica circuit part 705, a second replica circuit part 706, resistors 1201 to 1204, a comparator 1205, and a control circuit 704 according to a fifth embodiment. The resistors 1201 to 1204 and the comparator 1205 correspond to the comparison circuit 703 in FIG. 7. FIG. 12 illustrates the configuration made by providing the resistors 1201 to 1204 and the comparator 1205 in place of the comparison circuit 1001 with respect to that in FIG. 10. Hereinafter, points of the fifth embodiment different from the third embodiment will be described.

Each of the resistors 1201 to 1204 is an extremely large resistor with respect to 50Ω, and for example, 1 kΩ. The resistor 1201 is connected between the node N1a and a node N10. The resistor 1202 is connected between the node N10 and the node N4. The resistor 1203 is connected between the node N3 and a node N11. The resistor 1204 is connected between the node N11 and the node N2a.

The node N10 outputs an average signal level of the signal level V(+⅓) of the node N1a and the signal level V(−⅓) of the node N4. The node N11 outputs an average signal level of the signal level V(+⅓) of the node N3 and the signal level V(−⅓) of the node N2a.

The comparator 1205 compares the signal level of the node N10 and the signal level of the node N11, and outputs a comparison result signal to the control circuit 704. The control circuit 704 controls the currents of the variable current sources 941a to 944a and 941b to 944b by an adjusting code C1 on the basis of the comparison result signal of the comparator 1205 so that the signal level of the node N10 approaches the signal level of the node N11.

When the comparison result signal of the comparator 1205 indicates coincidence, the control circuit 704 fixes the adjusting code C1 and outputs an adjusting code C2 corresponding to the adjusting code C1 to the driver circuit 300a. The control circuit 704 controls the currents of the variable current sources 341 to 344 in the driver circuit 300a in FIG. 6A by the adjusting code C2. Thus, the RLM of the quaternary signal outputted from the driver circuit 300a is adjusted to 0.95 or more.

In the signal output circuit 112 in FIG. 11, error occurs in the signal levels of the nodes N7 and N8 in some cases due to the nonlinear characteristics of the n-channel field-effect transistors 1103 to 1006. According to this embodiment, no field-effect transistor is connected to the input node of the comparator 1205, thus making it possible to reduce the errors in the signal levels of the nodes N10 and N11 and to adjust the RLM with high accuracy. Further, since the comparator 1205 compares the average of the signal levels of the nodes N1a and N4 and the average of the signal levels of the nodes N3 and N2a, the signal output circuit 112 can adjust the RLM with high accuracy even when the common voltage of the node N5 and the common voltage of the node N6 are displaced. Further, exchange of the two input nodes of the comparator 1205 makes it possible to perform offset cancellation.

Sixth Embodiment

Figure 13:
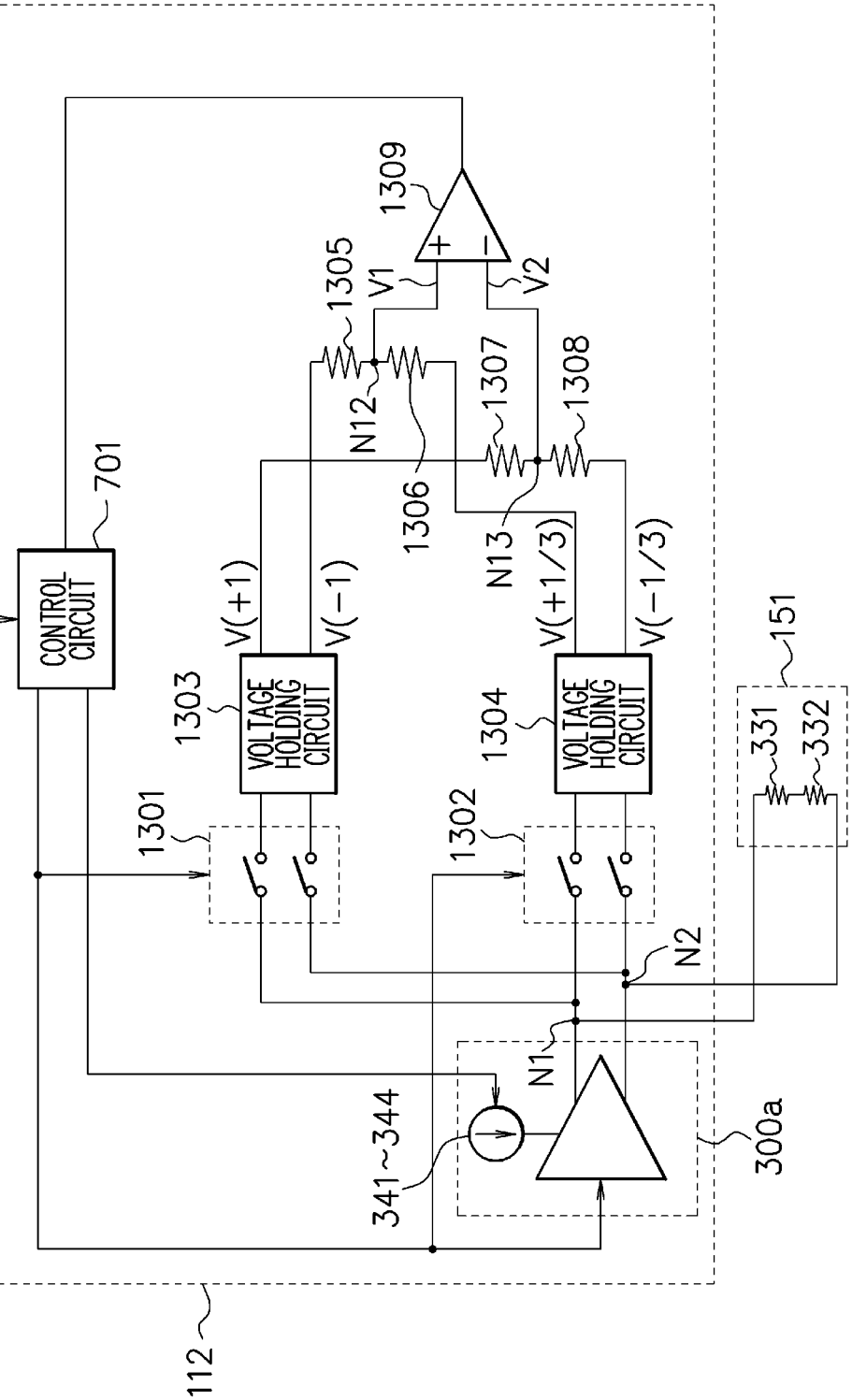
FIG. 13 is a diagram illustrating a configuration example of a signal output circuit according to a sixth embodiment.

FIG. 13 is a diagram illustrating a configuration example of a signal output circuit 112 according to a sixth embodiment. The signal output circuit 112 in FIG. 13 is made by deleting the replica circuit 702, the comparison circuit 703, and the control circuit 704 and adding switches 1301, 1302, voltage holding circuits 1303, 1304, resistors 1305 to 1308, and a comparison circuit 1309 with respect to the signal output circuit 112 in FIG. 7. As illustrated in FIG. 6A, the driver circuit 300a includes variable current sources 341 to 344, and the nodes N1 and N2 of the driver circuit 300a are connected to the DFE 151. The control circuit 701 controls the field-effect transistors 311 to 314 and 321 to 324 in the driver circuit 300a as illustrated in FIG. 3A and FIG. 3B and FIG. 4A and FIG. 4B on the basis of 2-bit parallel data D1 and D2 inputted from the multiplexer 111 in FIG. 1. The driver circuit 300a has the configuration of the driver circuit 300a illustrated in FIG. 6A, and outputs the signal level V(−1), V(−⅓), V(+⅓), or V(+1) corresponding to the quaternary signal from the nodes N1 and N2. The switch 1301 and the voltage holding circuit 1303 function as a first detection circuit that detects the signal levels V(−1) and V(+1) of the signal levels corresponding to the quaternary signal. The switch 1302 and the voltage holding circuit 1304 function as a second detection circuit that detects the signal levels V(−⅓) and V(+⅓) of the signal levels corresponding to the quaternary signal.

Next, a method for deciding the adjusting code for the variable current sources 341 to 344 in the driver circuit 300a will be described. First, the control circuit 701 sets the adjusting code for the variable current sources 341 to 344 to an initial value. Next, the control circuit 701 performs control to the state of the field-effect transistors 311 to 314 and 321 to 324 corresponding to the 2-bit parallel data "11" as illustrated in FIG. 3A to turn on the switch 1303 and turn off the switch 1302. Then, the driver circuit 300a outputs the signal level V(+1) from the node N1 and outputs the signal level V(−1) from the node N2. The voltage holding circuit 1303 holds the signal level V(+1) of the node N1 and the signal level V(−1) of the node N2. Thereafter, the control circuit 701 turns off the switch 1301.

Next, the control circuit 701 performs control to the state of the field-effect transistors 311 to 314 and 321 to 324 corresponding to the 2-bit parallel data "10" as illustrated in FIG. 3B to turn off the switch 1301 and turn on the switch 1302. Then, the driver circuit 300a outputs the signal level V(+⅓) from the node N1 and outputs the signal level V(−⅓) from the node N2. The voltage holding circuit 1304 holds the signal level V(+⅓) of the node N1 and the signal level V(−⅓) of the node N2. Thereafter, the control circuit 701 turns off the switch 1302.

The voltage holding circuit 1303 outputs the held signal levels V(+1) and V(−1). The voltage holding circuit 1304 outputs the held signal levels V(+⅓) and V(−⅓).

The resistor 1305 is connected between the node of the signal level V(−1) of the voltage holding circuit 1303 and the node N12. The resistor 1306 is connected between the node of the signal level V(+⅓) of the voltage holding circuit 1304 and the node N12. The ratio between the resistance value of the resistor 1305 and the resistance value of the resistor 1306 is 3:1. Each of the resistors 1305 and 1306 is an extremely large resistor with respect to Q. For example, the resistor 1305 is 3 kΩ and the resistor 1306 is 1 kΩ. The signal level V1 of the node N12 is expressed by the following expression. The signal level V1 is an intermediate signal level between the signal level V(−1) and the signal level V(+⅓), and corresponds to an average signal level of the signal level V(+⅓) and the signal level V(−⅓) as illustrated in FIG. 2A.

$$V1=(V(+⅓)-V(-1))\times ¾+V(-1)$$

The resistor 1307 is connected between the node of the signal level V(+1) of the voltage holding circuit 1303 and the node N13. The resistor 1308 is connected between the node of the signal level V(−⅓) of the voltage holding circuit 1304 and the node N13. The ratio between the resistance value of the resistor 1307 and the resistance value of the resistor 1308 is 3:1. Each of the resistors 1307 and 1308 is an extremely large resistor with respect to 50Ω. For example, the resistor 1307 is 3 kΩ and the resistor 1308 is 1 kΩ. The signal level V2 of the node N13 is expressed by the following expression. The signal level V2 is an intermediate signal level between the signal level V(−⅓) and the signal level V(+1), and corresponds to an average signal level of the signal level V(+⅓) and signal level V(−⅓) as illustrated in FIG. 2A.

$$V2=(V(+1)-V(-⅓))\times ¼+V(-⅓)$$

The comparison circuit 1309 compares the signal level V1 and the signal level V2, and outputs a comparison result signal. The control circuit 701 controls the currents of the variable current sources 341 to 344 in the driver circuit 300a by an adjusting code on the basis of the comparison result signal of the comparison circuit 1309 so that the signal level V1 approaches the signal level V2. When the signal level V1 becomes the same as the signal level V2, the control circuit 701 fixes the adjusting code. The variable current sources 341 to 344 in the driver circuit 300a are controlled in current by the adjusting code. Thus, the RLM of the quaternary signal outputted from the driver circuit 300a is adjusted to 0.95 or more.

Figure 14:
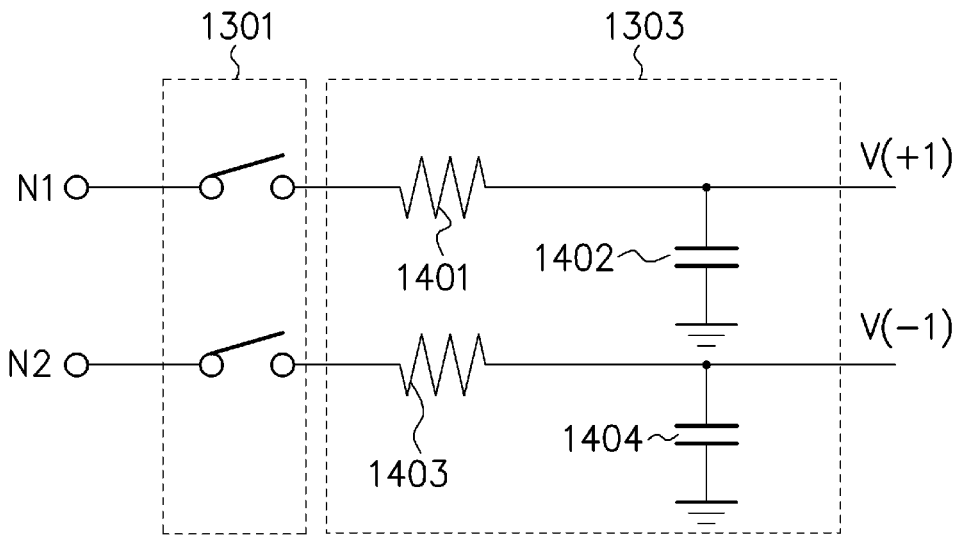
FIG. 14 is a diagram illustrating a configuration example of a voltage holding circuit.

FIG. 14 is a diagram illustrating a configuration example of the voltage holding circuit 1303 in FIG. 13. The voltage holding circuit 1303 includes resistors 1401, 1403 and capacitors 1402, 1404, holds the signal level V(+1) of the node N1 and the signal level V(−1) of the node N2, and outputs the signal levels V(+1) and V(−1). For example, each of the resistors 1401 and 1403 is 20 kΩ, and each of the capacitors 1402 and 1404 is 50 pF. As the resistors 1401 and 1403, the off-resistance of the field-effect transistor may be used. The voltage holding circuit 1304 in FIG. 13 has the same configuration as that of the voltage holding circuit 1303.

Figure 15:
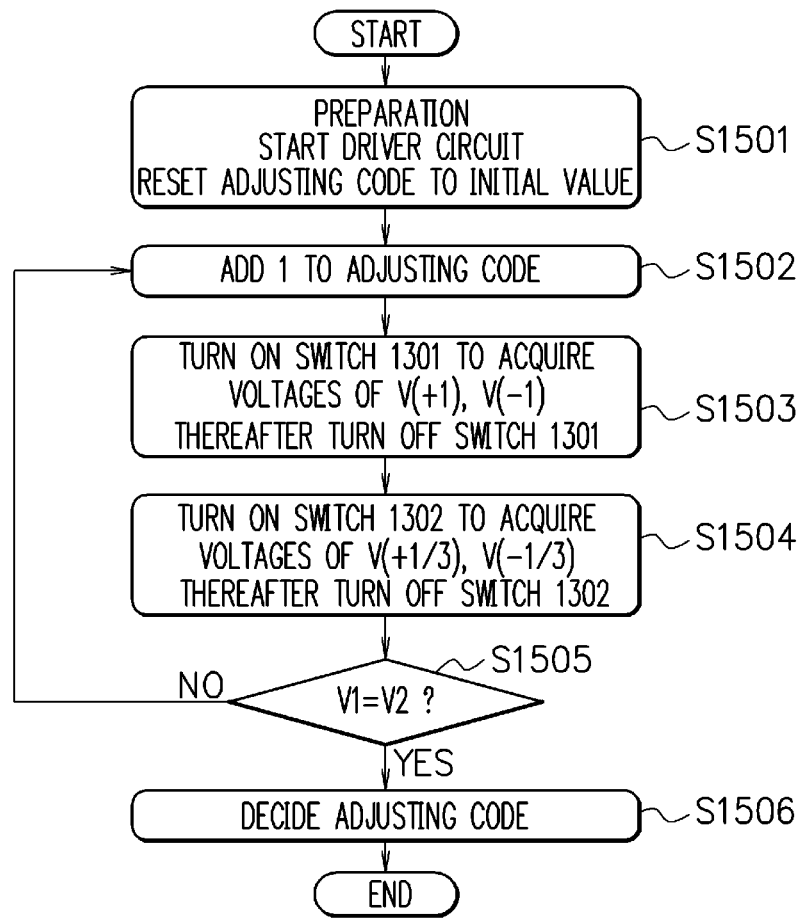
FIG. 15 is a flowchart illustrating a control method of an integrated circuit according to the sixth embodiment.

FIG. 15 is a flowchart illustrating a control method of the integrated circuit 100 according to this embodiment. At Step S1501, the integrated circuit 100 performs preparation processing in a test mode. The integrated circuit 100 starts the driver circuit 300a. The control circuit 701 resets the adjusting code to an initial value, and outputs the adjusting code of the initial value to the variable current sources 341 to 344. For example, the initial value of the adjusting code is the minimum value. The variable current sources 341 to 344 pass currents based on the adjusting code.

Next, at Step S1502, the control circuit 701 adds 1 to the adjusting code, and outputs the adjusting code after the addition to the variable current sources 341 to 344. The variable current sources 341 to 344 pass currents based on the adjusting code.

Next, at Step S1503, the control circuit 701 performs, as illustrated in FIG. 3A, control to the state of the field-effect transistors 311 to 314 and 321 to 324 corresponding to the 2-bit parallel data "11" to turn on the switch 1301 and turn off the switch 1302. Then, the driver circuit 300a outputs the signal level V(+1) from the node N1 and outputs the signal level V(−1) from the node N2. The voltage holding circuit 1303 holds the signal level V(+1) of the node N1 and the signal level V(−1) of the node N2. Thereafter, the control circuit 701 turns off the switch 1301. The voltage holding circuit 1303 outputs the held signal levels V(+1) and V(−1). The node N12 outputs the above-described signal level V1.

Next, at Step S1504, the control circuit 701 performs, as illustrated in FIG. 3B, control to the state of the field-effect transistors 311 to 314 and 321 to 324 corresponding to the 2-bit parallel data "10" to turn off the switch 1301 and turn on the switch 1302. Then, the driver circuit 300a outputs the signal level V(+⅓) from the node N1 and outputs the signal level V(−⅓) from the node N2. The voltage holding circuit 1304 holds the signal level V(+⅓) of the node N1 and the signal level V(−⅓) of the node N2. Thereafter, the control circuit 701 turns off the switch 1302. The voltage holding circuit 1304 outputs the held signal level V(+⅓) and signal level V(−⅓). The node N13 outputs the above-described signal level V2.

Next, at Step S1505, the control circuit 701 determines whether or not the signal level V1 is the same as the signal level V2 on the basis of the comparison result signal of the comparison circuit 1309. When the signal level V1 is not the same as the signal level V2, the control circuit 701 returns to Step S1502 and repeats the above-described processing. With an increase in the adjusting code, the signal level V1 approaches the signal level V2. When determining that the signal level V1 is the same as the signal level V2, the control circuit 701 proceeds to Step S1506.

At Step S1506, the control circuit 701 decides the present adjusting code as the adjusting code for normal mode, outputs the adjusting code for normal mode to the variable current sources 341 to 344 in the driver circuit 300a, turns off the switches 1301 and 1302, and ends the processing in the test mode. The integrated circuit 100 thereafter performs processing in the normal mode. Each of the variable current sources 341 to 344 in the driver circuit 300a passes a current based on the adjusting code for normal mode.

The driver circuit 300a can output the signal levels V(−1), V(−⅓), V(+⅓), and V(+1) at regular intervals from each other on the basis of the adjusting code for normal mode. Thus, the RLM of the quaternary signal outputted from the driver circuit 300a is improved. Improving the RLM improves the quality of the quaternary signal, thus allowing the reception circuit 133 to reduce the reproduction error of the quaternary signal.

Note that at Step S1506, the control circuit 701 may exchange a + input terminal and a − input terminal of the comparison circuit 1309, reset the adjusting code to the maximum value, repeat the processing of subtracting 1 from the adjusting code until the signal levels V1 and V2 become the same, and decide the adjusting code for normal mode. Then, the control circuit 701 can decide an average value of the adjusting code for normal mode when the adjusting code is increased from the minimum value and the adjusting code for normal mode when the adjusting code is decreased from the maximum value, as a final adjusting code for normal mode. This makes it possible to reduce the error due to the offset of the comparison circuit 1309. This processing is applicable also to the processing in FIG. 8.

In the case of FIG. 7, an error may occur in transistor characteristics of the driver circuit 300a and the replica circuit 702. If the error occurs, the RLM of the quaternary signal outputted from the driver circuit 300a decreases in some cases. According to this embodiment, since the replica circuit 702 is not used, it is possible to prevent the decrease in the RLM of the quaternary signal outputted from the driver circuit 300a on the basis of the replica circuit 702.

Seventh Embodiment

Figure 16:
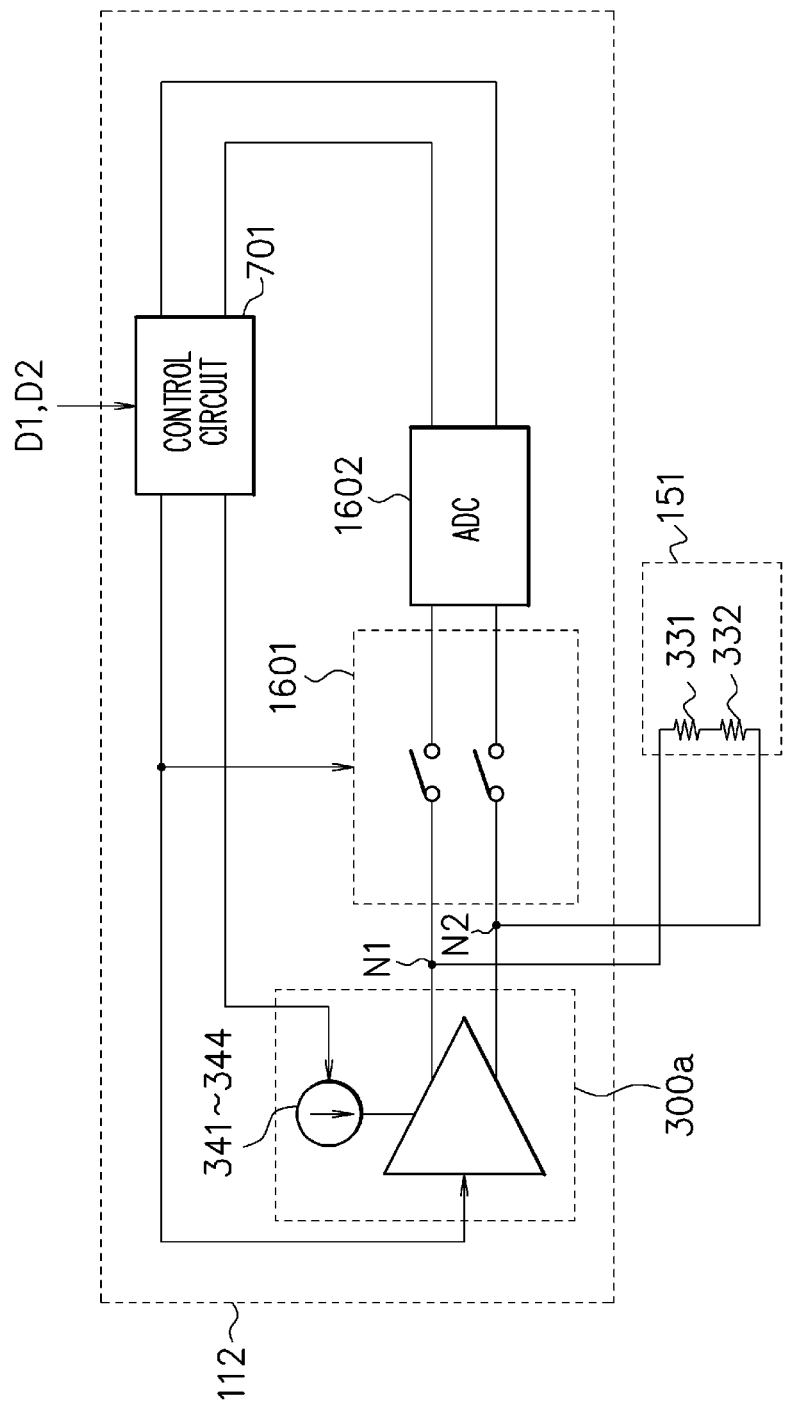
FIG. 16 is a diagram illustrating a configuration example of a signal output circuit according to a seventh embodiment.

FIG. 16 is a diagram illustrating a configuration example of a signal output circuit 112 according to a seventh embodiment. The signal output circuit 112 in FIG. 16 is made by deleting the switches 1301, 1302, the voltage holding circuits 1303, 1304, the resistors 1305 to 1308, and the comparison circuit 1309 and adding a switch 1601 and an analog-digital converter (ADC) 1602 with respect to the signal output circuit 112 in FIG. 13. The switch 1601 and the analog-digital converter (ADC) 1602 function as a first detection circuit that detects the signal levels V(−1) and V(+1) of the signal levels corresponding to the quaternary signal. Further, the switch 1601 and the analog-digital converter (ADC) 1602 function as a second detection circuit that detects the signal levels V(−⅓) and V(+⅓) of the signal levels corresponding to the quaternary signal.

Next, a method for deciding the adjusting code for the variable current sources 341 to 344 in the driver circuit 300a will be described. First, the control circuit 701 sets the adjusting code for the variable current sources 341 to 344 to an initial value. Next, the control circuit 701 performs, as illustrated in FIG. 3A, control to the state of the field-effect transistors 311 to 314 and 321 to 324 corresponding to the 2-bit parallel data "11" to turn on the switch 1601. Then, the driver circuit 300a outputs the signal level V(+1) from the node N1 and outputs the signal level V(−1) from the node N2. The analog-digital converter 1602 converts the signal level V(+1) of the node N1 and the signal level V(−1) of the node N2 from analog values to digital values. The control circuit 701 holds the signal levels V(+1) and V(−1) of the digital values outputted from the analog-digital converter 1602. Thereafter, the control circuit 701 turns off the switch 1601.

Next, the control circuit 701 performs, as illustrated in FIG. 3B, control to the state of the field-effect transistors 311 to 314 and 321 to 324 corresponding to the 2-bit parallel data "10" to turn on the switch 1601. Then, the driver circuit 300a outputs the signal level V(+⅓) from the node N1 and outputs the signal level V(−⅓) from the node N2. The analog-digital converter 1602 converts the signal level V(+⅓) of the node N1 and the signal level V(−⅓) of the node N2 from analog values to digital values. The control circuit 701 holds the signal levels V(+⅓) and V(−⅓) of the digital values outputted from the analog-digital converter 1602. Thereafter, the control circuit 701 turns off the switch 1601.

Next, the control circuit 701 performs digital processing corresponding to the resistors 1305 to 1308 and the comparison circuit 1309 in FIG. 13 on the basis of the signal levels V(+1), V(−1), V(+⅓), and V(−⅓) of the digital values, and compares the signal levels V1 and V2. The control circuit 701 thereafter performs the same processing as that in the sixth embodiment.

Figure 17:
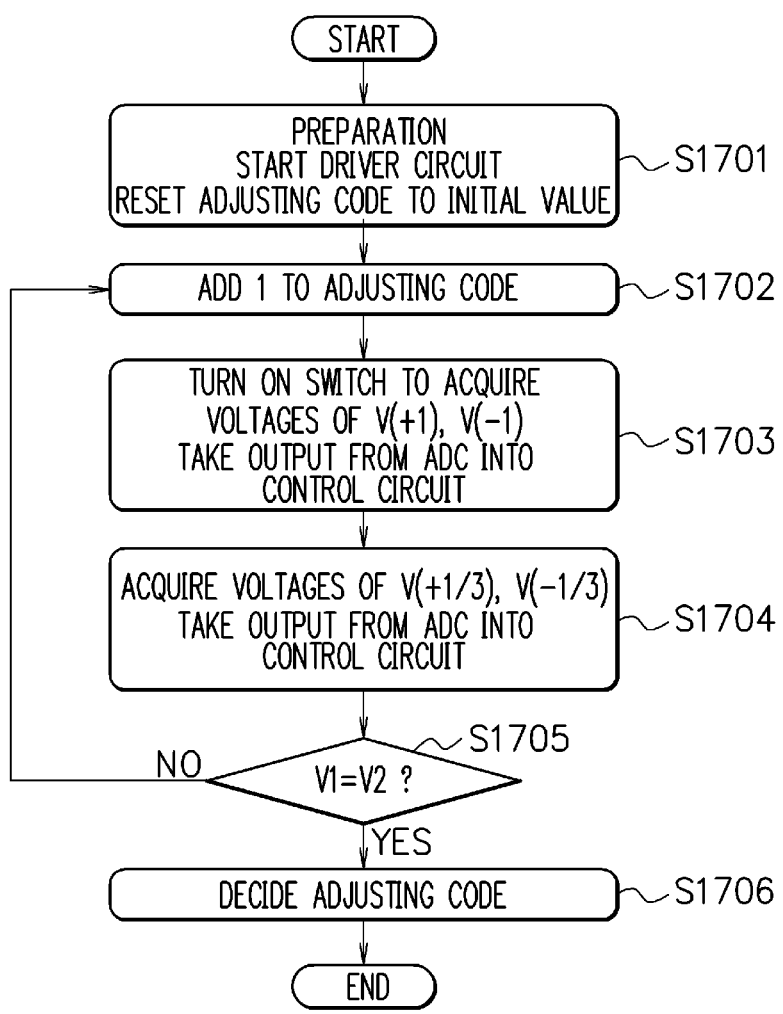
FIG. 17 is a flowchart illustrating a control method of an integrated circuit according to the seventh embodiment.

FIG. 17 is a flowchart illustrating a control method of the integrated circuit 100 according to this embodiment. At Step S1701, the integrated circuit 100 performs preparation processing in a test mode. The integrated circuit 100 starts the driver circuit 300a. The control circuit 701 resets the adjusting code to an initial value, and outputs the adjusting code of the initial value to the variable current sources 341 to 344. For example, the initial value of the adjusting code is the minimum value. The variable current sources 341 to 344 pass currents based on the adjusting code.

Next, at Step S1702, the control circuit 701 adds 1 to the adjusting code, and outputs the adjusting code after the addition to the variable current sources 341 to 344. The variable current sources 341 to 344 pass currents based on the adjusting code.

Next, at Step S1703, the control circuit 701 performs, as illustrated in FIG. 3A, control to the state of the field-effect transistors 311 to 314 and 321 to 324 corresponding to the 2-bit parallel data "11" to turn on the switch 1601. Then, the driver circuit 300a outputs the signal level V(+1) from the node N1 and outputs the signal level V(−1) from the node N2. The analog-digital converter 1602 converts the signal level V(+1) of the node N1 and the signal level V(−1) of the node N2 from analog values to digital values. The control circuit 701 holds the signal levels V(+1) and V(−1) of the digital values outputted from the analog-digital converter 1602. Thereafter, the control circuit 701 turns off the switch 1601.

Next, at Step S1704, the control circuit 701 performs, as illustrated in FIG. 3B, control to the state of the field-effect transistors 311 to 314 and 321 to 324 corresponding to the 2-bit parallel data "10" to turn on the switch 1601. Then, the driver circuit 300a outputs the signal level V(+⅓) from the node N1 and outputs the signal level V(−⅓) from the node N2. The analog-digital converter 1602 converts the signal level V(+⅓) of the node N1 and the signal level V(−⅓) of the node N2 from analog values to digital values. The control circuit 701 holds the signal levels V(+⅓) and V(−⅓) of the digital values outputted from the analog-digital converter 1602. Thereafter, the control circuit 701 turns off the switch 1601.

Next, at Step S1705, the control circuit 701 calculates the signal level V1 based on the digital signal levels V(+⅓) and V(−1), and calculates the signal level V2 based on the digital signal levels V(+1) and V(−⅓) as in FIG. 13. Next, the control circuit 701 determines whether or not the signal level V1 is the same as the signal level V2. When the signal level V1 is not the same as the signal level V2, the control circuit 701 returns to Step S1702 and repeats the above-described processing. With an increase in the adjusting code, the signal level V1 approaches the signal level V2. When determining that the signal level V1 is the same as the signal level V2, the control circuit 701 proceeds to Step S1706.

At Step S1706, the control circuit 701 decides the present adjusting code as an adjusting code for normal mode, outputs the adjusting code for normal mode to the variable current sources 341 to 344 in the driver circuit 300a, turns off the switch 1601, and ends the processing in the test mode. The integrated circuit 100 thereafter performs processing in the normal mode. Each of the variable current sources 341 to 344 in the driver circuit 300a passes a current based on the adjusting code for normal mode.

The driver circuit 300a can output the signal levels V(−1), V(−⅓), V(+⅓), and V(+1) at regular intervals from each other on the basis of the adjusting code for normal mode. Thus, the RLM of the quaternary signal outputted from the driver circuit 300a is improved. Improving the RLM improves the quality of the quaternary signal, thus allowing the reception circuit 133 to reduce the reproduction error of the quaternary signal.

Eighth Embodiment

FIG. 18 is a diagram illustrating a configuration example of a signal output circuit 112 according to an eighth embodiment. The signal output circuit 112 in FIG. 18 is made by deleting the voltage holding circuits 1303, 1304, the resistors 1305 to 1308, and the comparison circuit 1309 and adding operational amplifiers 1803, 1804, resistors 1805 to 1808, and analog-digital converters (ADCs) 1809, 1810 with respect to the signal output circuit 112 in FIG. 13. The switch 1301, the operational amplifier 1803, and the resistors 1805, 1807 function as a first detection circuit that detects the signal levels V(−1) and V(+1) of the signal levels corresponding to the quaternary signal and output a difference between the signal levels V(+1) and v(−1). Further, the switch 1302, the operational amplifier 1804, and the resistors 1806, 1808 function as a second detection circuit that detects the signal levels V(−⅓) and V(+⅓) of the signal levels corresponding to the quaternary signal and output a difference between the signal levels V(+⅓) and v(−⅓).

Next, a method for deciding the adjusting code for the variable current sources 341 to 344 in the driver circuit 300a will be described. First, the control circuit 701 sets the adjusting code for the variable current sources 341 to 344 to an initial value. Next, the control circuit 701 performs, as illustrated in FIG. 3A, control to the state of the field-effect transistors 311 to 314 and 321 to 324 corresponding to the 2-bit parallel data "11" to turn on the switch 1301 and turn off the switch 1302. Then, the driver circuit 300a outputs the signal level V(+1) from the node N1 and outputs the signal level V(−1) from the node N2.

The resistor 1805 is connected between a + input terminal and an output terminal of the operational amplifier 1803. The resistor 1807 is connected between a − input terminal of the operational amplifier 1803 and the reference potential node. The operational amplifier 1803 receives input of the signal level V(+1) of the node N1 and the signal level V(−1) of the node N2, and outputs a difference V(+1)−V(−1) between the signal levels V(+1) and V(−1). The analog-digital converter 1809 converts the difference V(+1)−V(−1) outputted from the operational amplifier 1803 from analog to digital. The control circuit 701 holds a digital value V(+1)−V(−1) outputted from the analog-digital converter 1809.

Next, the control circuit 701 performs, as illustrated in FIG. 3B, control to the state of the field-effect transistors 311 to 314 and 321 to 324 corresponding to the 2-bit parallel data "10" to turn off the switch 1301 and turn on the switch 1302. Then, the driver circuit 300a outputs the signal level V(+⅓) from the node N1 and outputs the signal level V(−⅓) from the node N2.

The resistor 1806 is connected between a + input terminal and an output terminal of the operational amplifier 1804. The resistor 1808 is connected between a − input terminal of the operational amplifier 1804 and the reference potential node. The operational amplifier 1804 receives input of the signal level V(+⅓) of the node N1 and the signal level V(−⅓) of the node N2, and outputs a difference V(+⅓)−V(−⅓) between the signal levels V(+⅓) and V(−⅓). The analog-digital converter 1810 converts the difference V(+⅓)−V(−⅓) outputted from the operational amplifier 1804 from analog to digital. The control circuit 701 holds a digital value V(+⅓)−V(−⅓) outputted from the analog-digital converter 1810.

Next, the control circuit 701 trebles the digital value V(+⅓)−V(−⅓) to obtain a digital value {V(+⅓)−V(−⅓)}×3. The digital value {V(+⅓)−V(−⅓)}×3 corresponds to the difference value V(+1)−V(−1) as illustrated in FIG. 2A.

The control circuit 701 compares the above-described digital value V(+1)−V(−1) and digital value {V(+⅓)−V(−⅓)}×3. Then, the control circuit 701 controls the currents of the variable current sources 341 to 344 in the driver circuit 300a by the adjusting code so that the digital value V(+1)−V(−1) approaches the digital value {V(+⅓)−V(−⅓)}×3. When the digital value V(+1)−V(−1) and the digital value {V(+⅓)−V(−⅓)}×3 become the same, the control circuit 701 fixes the adjusting code. The variable current sources 341 to 344 in the driver circuit 300a are controlled in current by the adjusting code. Thus, the RLM of the quaternary signal outputted from the driver circuit 300a is adjusted to 0.95 or more.

FIG. 19 is a flowchart illustrating a control method of the integrated circuit 100 according to this embodiment. At Step S1901, the integrated circuit 100 performs preparation processing in a test mode. The integrated circuit 100 starts the driver circuit 300a. The control circuit 701 resets the adjusting code to an initial value, and outputs the adjusting code of the initial value to the variable current sources 341 to 344. For example, the initial value of the adjusting code is the minimum value. The variable current sources 341 to 344 pass currents based on the adjusting code.

Next, at Step S1902, the control circuit 701 adds 1 to the adjusting code, and outputs the adjusting code after the addition to the variable current sources 341 to 344. The variable current sources 341 to 344 pass currents based on the adjusting code.

Next, at Step S1903, the control circuit 701 performs, as illustrated in FIG. 3A, control to the state of the field-effect transistors 311 to 314 and 321 to 324 corresponding to the 2-bit parallel data "11" to turn on the switch 1301 and turn off the switch 1302. Then, the driver circuit 300a outputs the signal level V(+1) from the node N1 and outputs the signal level V(−1) from the node N2. The operational amplifier 1803 receives input of the signal level V(+1) of the node N1 and the signal level V(−1) of the node N2, and outputs a difference V(+1)−V(−1) between the signal levels V(+1) and V(−1). The analog-digital converter 1809 converts the difference V(+1)−V(−1) outputted from the operational amplifier 1803 from analog to digital. The control circuit 701 holds a digital value V(+1)−V(−1) outputted from the analog-digital converter 1809 as a digital value V1. The control circuit 701 thereafter turns off the switch 1301.

Next, at Step S1904, the control circuit 701 performs, as illustrated in FIG. 3B, control to the state of the field-effect transistors 311 to 314 and 321 to 324 corresponding to the 2-bit parallel data "10" to turn off the switch 1301 and turn on the switch 1302. Then, the driver circuit 300*a* outputs the signal level V(+⅓) from the node N1 and outputs the signal level V(−⅓) from the node N2. The operational amplifier 1804 receives input of the signal level V(+⅓) of the node N1 and the signal level V(−⅓) of the node N2, and outputs a difference V(+⅓)−V(−⅓) between the signal levels V(+⅓) and V(−⅓). The analog-digital converter 1810 converts the difference V(+⅓)−V(−⅓) outputted from the operational amplifier 1804 from analog to digital. The control circuit 701 holds a digital value V(+⅓)−V(−⅓) outputted from the analog-digital converter 1810. The control circuit 701 then trebles the digital value V(+⅓)−V(−⅓) and holds a digital value {V(+⅓)−V(−⅓)}×3 as a digital signal V2. Thereafter, the control circuit 701 turns off the switch 1302.

Next, at Step S1905, the control circuit 701 determines whether or not the digital value V1 is the same as the digital value V2. When the digital value V1 is not the same as the digital value V2, the control circuit 701 returns to Step S1902 and repeats the above-described processing. With an increase in the adjusting code, the digital value V1 approaches the digital value V2. When determining that the digital value V1 is the same as the digital value V2, the control circuit 701 proceeds to Step S1906.

At Step S1906, the control circuit 701 decides the present adjusting code as an adjusting code for normal mode, outputs the adjusting code for normal mode to the variable current sources 341 to 344 in the driver circuit 300*a*, turns off the switches 1301 and 1302, and ends the processing in the test mode. The integrated circuit 100 thereafter performs processing in the normal mode. Each of the variable current sources 341 to 344 in the driver circuit 300*a* passes a current based on the adjusting code for normal mode.

The driver circuit 300*a* can output the signal levels V(−1), V(−⅓), V(+⅓), and V(+1) at regular intervals from each other on the basis of the adjusting code for normal mode. Thus, the RLM of the quaternary signal outputted from the driver circuit 300*a* is improved. Improving the RLM improves the quality of the quaternary signal, thus allowing the reception circuit 133 to reduce the reproduction error of the quaternary signal.

Note that the above-described embodiments merely illustrate examples of materialization in implementing the present invention, and the technical scope of the present invention is not to be construed in a restrictive manner by these embodiments. That is, the present invention may be implemented in various forms without departing from the technical spirit or main features thereof.

In one aspect, it is possible to adjust a plurality of signal levels corresponding to a multilevel signal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A signal output circuit comprising:
a driver circuit including a variable current source and configured to output a multilevel signal;
a replica circuit having a circuit configuration equivalent to the driver circuit; and
a control circuit configured to control a characteristic of the driver circuit, based on an output signal of the replica circuit, wherein
the replica circuit includes:
a first replica circuit part configured to output first output signals having signal levels of a first subset of a plurality of signal levels corresponding to the multilevel signal; and
a second replica circuit part configured to output second output signals having signal levels of a second subset of the plurality of signal levels, and
the control circuit is configured to control a characteristic of the variable current source, based on the first output signals and the second output signals.

2. The signal output circuit according to claim 1, wherein:
the driver circuit is configured to output a quaternary signal;
the first replica circuit part is configured to output the first output signals having the signal levels of a first subset of first to fourth signal levels corresponding to the quaternary signal; and
the second replica circuit part is configured to output the second output signals having the signal levels of a second subset of the first to fourth signal levels corresponding to the quaternary signal.

3. The signal output circuit according to claim 2, wherein:
the first replica circuit part is configured to generate the second signal level lower than the first signal level, and a third signal level lower than the second signal level;
the second replica circuit part is configured to generate the first signal level, and the fourth signal level lower than the third signal level; and
the control circuit is configured to control a current of the variable current source, based on the first to fourth signal levels.

4. The signal output circuit according to claim 3, wherein:
the second replica circuit part is further configured to generate a fifth signal level lower than the first signal level and higher than the fourth signal level and a sixth signal level lower than the fifth signal level and higher than the fourth signal level, based on the first signal level and the fourth signal level; and
the control circuit is configured to control the current of the variable current source, based on the second signal level, the third signal level, the fifth signal level, and the sixth signal level.

5. The signal output circuit according to claim 4, wherein a level difference between the first signal level and the fifth signal level, a level difference between the fifth signal level and the sixth signal level, and a level difference between the sixth signal level and the fourth signal level are equal to one another.

6. The signal output circuit according to claim 4, wherein the control circuit is configured to control the current of the variable current source so that the second signal level approaches the fifth signal level and the third signal level approaches the sixth signal level.

7. The signal output circuit according to claim 4, wherein the control circuit is configured to control the current of the variable current source so that a level difference between the third signal level and the second signal level approaches the level difference between the sixth signal level and the fifth signal level.

8. The signal output circuit according to claim 4, wherein the control circuit is configured to control the current of the variable current source so that a sum of the second signal level and the sixth signal level approaches a sum of the third signal level and the fifth signal level.

9. The signal output circuit according to claim 4, wherein the control circuit is configured to control the current of the variable current source so that an average of the second signal level and the sixth signal level approaches an average of the third signal level and the fifth signal level.

10. The signal output circuit according to claim 2, wherein the driver circuit includes:
a first resistor and a first switch connected in series between a power supply potential node and a first node;
a second resistor and a second switch connected in series between the power supply potential node and the first node;
a third resistor and a third switch connected in series between the first node and a reference potential node;
a fourth resistor and a fourth switch connected in series between the first node and the reference potential node;
a fifth resistor and a fifth switch connected in series between the power supply potential node and a second node;
a sixth resistor and a sixth switch connected in series between the power supply potential node and the second node;
a seventh resistor and a seventh switch connected in series between the second node and the reference potential node;
an eighth resistor and an eighth switch connected in series between the second node and the reference potential node;
a first variable current source connected between the power supply potential node and the first node;
a second variable current source connected between the first node and the reference potential node;
a third variable current source connected between the power supply potential node and the second node; and
a fourth variable current source connected between the second node and the reference potential node.

11. The signal output circuit according to claim 10, wherein:
the first replica circuit part includes:
a ninth resistor and a ninth switch connected in series between the power supply potential node and a third node;
a tenth resistor and a tenth switch connected in series between the third node and the reference potential node;
an eleventh resistor and an eleventh switch connected in series between the power supply potential node and a fourth node;
a twelfth resistor and a twelfth switch connected in series between the fourth node and the reference potential node;
a fifth variable current source connected between the power supply potential node and the third node;
a sixth variable current source connected between the third node and the reference potential node;
a seventh variable current source connected between the power supply potential node and the fourth node; and
an eighth variable current source connected between the fourth node and the reference potential node; and the second replica circuit part includes:
a thirteenth resistor and a thirteenth switch connected in series between the power supply potential node and a fifth node;
a fourteenth resistor and a fourteenth switch connected in series between the power supply potential node and the fifth node;
a fifteenth resistor and a fifteenth switch connected in series between a sixth node and the reference potential node;
a sixteenth resistor and a sixteenth switch connected in series between the sixth node and the reference potential node;
a ninth variable current source connected between the power supply potential node and the fifth node;
a tenth variable current source connected between the fifth node and the reference potential node;
an eleventh variable current source connected between the power supply potential node and the sixth node; and
a twelfth variable current source connected between the sixth node and the reference potential node.

12. The signal output circuit according to claim 11, wherein:
the first replica circuit part further includes a seventeenth resistor connected between the third node and the fourth node; and
the second replica circuit part further comprises:
an eighteenth resistor connected between the fifth node and a seventh node;
a nineteenth resistor connected between the seventh node and an eighth node; and
a twentieth resistor connected between the eighth node and the sixth node.

13. A transmission circuit comprising:
a multiplexer configured to multiplex parallel data of a first number of bits into parallel data of a second number of bits smaller than the first number of bits; and
a signal output circuit configured to receive the parallel data of the second number of bits, wherein
the signal output circuit includes:
a driver circuit including a variable current source and configured to output a multilevel signal;
a replica circuit having a circuit configuration equivalent to the driver circuit; and
a control circuit configured to control a characteristic of the driver circuit, based on an output signal of the replica circuit, wherein
the replica circuit includes:
a first replica circuit part configured to output first output signals having signal levels of a first subset of a plurality of signal levels corresponding to the multilevel signal; and
a second replica circuit part configured to output second output signals having signal levels of a second subset of the plurality of signal levels, and
the control circuit is configured to control a characteristic of the variable current source, based on the first output signals and the second output signals.

14. The transmission circuit according to claim 13, wherein:
the driver circuit is configured to output a quaternary signal;
the first replica circuit part is configured to output the first output signals having the signal levels of a first subset of first to fourth signal levels corresponding to the quaternary signal; and the second replica circuit part is configured to output the second output signals having the signal levels of a second subset of the first to fourth signal levels corresponding to the quaternary signal.

15. The transmission circuit according to claim 14, wherein:
the first replica circuit part is configured to generate the second signal level lower than the first signal level, and a third signal level lower than the second signal level;
the second replica circuit part is configured to generate the first signal level, and the fourth signal level lower than the third signal level; and
the control circuit is configured to control a current of the variable current source, based on the first to fourth signal levels.

16. The transmission circuit according to claim 14, wherein:
the second replica circuit part is further configured to generate a fifth signal level lower than the first signal level and higher than the fourth signal level and a sixth signal level lower than the fifth signal level and higher than the fourth signal level, based on the first signal level and the fourth signal level; and
the control circuit is configured to control the current of the variable current source, based on the second signal level, a third signal level, the fifth signal level, and the sixth signal level.

17. An integrated circuit comprising:
an internal circuit configured to generate parallel data of a first number of bits; and
a transmission circuit configured to receive the parallel data of the first number of bits, wherein the transmission circuit includes:
a multiplexer configured to multiplex the parallel data of the first number of bits into parallel data of a second number of bits smaller than the first number of bits; and
a signal output circuit configured to receive input of the parallel data of the second number of bits, wherein the signal output circuit includes:
a driver circuit including a variable current source and configured to output a multilevel signal;
a replica circuit having a circuit configuration equivalent to the driver circuit; and
a control circuit configured to control a characteristic of the driver circuit, based on an output signal of the replica circuit, wherein
the replica circuit includes:
a first replica circuit part configured to output first output signals having signal levels of a first subset of a plurality of signal levels corresponding to the multilevel signal; and
a second replica circuit part configured to output second output signals having signal levels of a second subset of the plurality of signal levels, and
the control circuit is configured to control a characteristic of the variable current source, based on the first output signals and the second output signals.

18. The integrated circuit according to claim 17, wherein:
the driver circuit is configured to output a quaternary signal;
the first replica circuit part is configured to output the first output signals having signal levels of a first subset of first to fourth signal levels corresponding to the quaternary signal; and
the second replica circuit part is configured to output the second output signals having signal levels of a second subset of the first to fourth signal levels corresponding to the quaternary signal.

19. The integrated circuit according to claim 18, wherein:
the first replica circuit part is configured to generate the second signal level lower than the first signal level, and a third signal level lower than the second signal level;
the second replica circuit part is configured to generate the first signal level, and the fourth signal level lower than the third signal level; and
the control circuit is configured to control a current of the variable current source, based on the first to fourth signal levels.

20. The integrated circuit according to claim 18, wherein:
the second replica circuit part is further configured to generate a fifth signal level lower than the first signal level and higher than the fourth signal level and a sixth signal level lower than the fifth signal level and higher than the fourth signal level, based on the first signal level and the fourth signal level; and
the control circuit is configured to control the current of the variable current source, based on the second signal level, a third signal level, the fifth signal level, and the sixth signal level.

* * * * *